(12) United States Patent
Jung et al.

(10) Patent No.: US 10,332,948 B2
(45) Date of Patent: Jun. 25, 2019

(54) TRANSPARENT DISPLAY DEVICES AND METHODS OF MANUFACTURING TRANSPARENT DISPLAY DEVICES

(71) Applicant: SAMSUNG DISPLAY CO., LTD., Yongin-si, Gyeonggi-do (KR)

(72) Inventors: Seung-Ho Jung, Yongin-si (KR); Chaun-Gi Choi, Yongin-si (KR); Young-Sik Yoon, Yongin-si (KR); Joo-Hee Jeon, Yongin-si (KR); Jung-Yun Jo, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/498,250

(22) Filed: Apr. 26, 2017

(65) Prior Publication Data

US 2017/0229529 A1    Aug. 10, 2017

Related U.S. Application Data

(62) Division of application No. 14/817,632, filed on Aug. 4, 2015, now Pat. No. 9,647,045.

(30) Foreign Application Priority Data

Oct. 30, 2014    (KR) .................. 10-2014-0149057

(51) Int. Cl.
  *H01L 51/52*    (2006.01)
  *H01L 27/32*    (2006.01)
(52) U.S. Cl.
  CPC ...... *H01L 27/3258* (2013.01); *H01L 27/3244* (2013.01); *H01L 27/3246* (2013.01);
  (Continued)

(58) Field of Classification Search
  CPC ............. H01L 27/3258; H01L 27/3246; H01L 27/3248; H01L 2227/323
  (Continued)

(56) References Cited

U.S. PATENT DOCUMENTS

| 5,508,532 A | 4/1996 | Teramoto |
| 9,318,427 B2 | 4/2016 | Youn et al. |

(Continued)

FOREIGN PATENT DOCUMENTS

| KR | 10-2011-0074284 A | 6/2011 |
| KR | 10-2011-0085780 A | 7/2011 |

(Continued)

OTHER PUBLICATIONS

Lee, Do Kyung, et al., "Characteristics of Silicon Oxynitride Barrier Films Grown on Poly(ethylene naphthalate) by Ion-Beam-Assisted Deposition", Japanese Journal of Applied Physics, vol. 49 05EA14, (2010).

*Primary Examiner* — Marc Anthony Armand
(74) *Attorney, Agent, or Firm* — Lee & Morse, P.C.

(57) ABSTRACT

A transparent display substrate, a transparent display device, and a method of manufacturing a transparent display device, the substrate including a base substrate including a pixel area and a transmission area; a pixel circuit on the pixel area of the base substrate; an insulation layer covering the pixel circuit on the base substrate; a pixel electrode selectively disposed on the pixel area of the base substrate, the pixel electrode being electrically connected to the pixel circuit at least partially through the insulation layer; and a transmitting layer structure selectively disposed on the transmission area of the base substrate, the transmitting layer structure including at least an inorganic material, the inorganic material consisting essentially of silicon oxynitride.

6 Claims, 13 Drawing Sheets

(52) U.S. Cl.
CPC ...... *H01L 27/3248* (2013.01); *H01L 51/5281* (2013.01); *H01L 2227/323* (2013.01)

(58) Field of Classification Search
USPC .......................................................... 257/72
See application file for complete search history.

(56) References Cited

U.S. PATENT DOCUMENTS

| | | |
|---|---|---|
| 2003/0111666 A1 | 6/2003 | Nishi et al. |
| 2005/0140868 A1 | 6/2005 | Hwang |
| 2008/0116460 A1 | 5/2008 | Choi |
| 2009/0142905 A1 | 6/2009 | Yamazaki |
| 2010/0323529 A1 | 12/2010 | Honda et al. |
| 2011/0163661 A1* | 7/2011 | Lee .................... H01L 27/3227 313/504 |
| 2013/0043466 A1 | 2/2013 | Nomura et al. |
| 2013/0328022 A1* | 12/2013 | Choi .................. H01L 51/5008 257/40 |
| 2014/0183472 A1* | 7/2014 | Kim .................... H01L 27/3258 257/40 |
| 2015/0060778 A1* | 3/2015 | Kim .................... H01L 27/3258 257/40 |

FOREIGN PATENT DOCUMENTS

| | | |
|---|---|---|
| KR | 10-2012-0003165 A | 1/2012 |
| KR | 10-2012-0019025 A | 3/2012 |

* cited by examiner

TRANSPARENT DISPLAY DEVICES AND METHODS OF MANUFACTURING TRANSPARENT DISPLAY DEVICES

CROSS-REFERENCE TO RELATED APPLICATIONS

This is a divisional application based on pending application Ser. No. 14/817,632, filed Aug. 4, 2015, the entire contents of which is hereby incorporated by reference.

Korean Patent Application No. 10-2014-0149057, filed on Oct. 30, 2014, in the Korean Intellectual Property Office, and entitled: "Transparent Display Substrates, Transparent Display Devices and Methods of Manufacturing Transparent Display Devices," is incorporated by reference herein in its entirety.

BACKGROUND

1. Field

Embodiments relate to transparent display substrates, transparent display devices, and methods of manufacturing transparent display devices.

2. Description of the Related Art

Recently, a display device, e.g., an organic light emitting display (OLED) device having transparent or transmitting properties has been considered.

SUMMARY

Embodiments are directed to transparent display substrates, transparent display devices, and methods of manufacturing transparent display devices.

The embodiments may be realized by providing a transparent display substrate, including a base substrate including a pixel area and a transmission area; a pixel circuit on the pixel area of the base substrate; an insulation layer covering the pixel circuit on the base substrate; a pixel electrode selectively disposed on the pixel area of the base substrate, the pixel electrode being electrically connected to the pixel circuit at least partially through the insulation layer; and a transmitting layer structure selectively disposed on the transmission area of the base substrate, the transmitting layer structure including at least an inorganic material, the inorganic material consisting essentially of silicon oxynitride.

The transparent display substrate may further include a barrier layer between the base substrate and the pixel circuit.

The transparent display substrate may further include a buffer layer between the barrier layer and the pixel circuit.

The barrier layer and the buffer layer may consist essentially of silicon oxynitride.

The transmitting layer structure may include portions of the barrier layer and the buffer layer that are formed on the transmission area.

The portions of the barrier layer and the buffer layer included in the transmitting layer structure may be merged with each other such that the transmitting layer structure has a single-layered structure.

The insulation layer may be disposed selectively on the pixel area, and does not extend on the transmission area.

The pixel circuit may include an active pattern, a gate electrode, a source electrode and a drain electrode stacked on the barrier layer, the insulation layer may include a gate insulation layer covering the active pattern on the barrier layer; an insulating interlayer covering the gate electrode on the gate insulation layer; and a via insulation layer covering the source electrode and the drain electrode on the insulating interlayer, the source electrode and the drain electrode may extend through the insulating interlayer and the gate insulation layer to be in contact with the active pattern, and the pixel electrode may be on the via insulation layer and may extend through the via insulation layer to be in contact with the drain electrode.

The via insulation layer may include an organic material, and is selectively disposed on the pixel area.

The gate insulation layer and the insulating interlayer may consist essentially of silicon oxynitride.

The gate insulation layer and the insulating interlayer may extend commonly and continuously on the pixel area and the transmission area. The transmitting layer structure may include portions of the barrier layer, the gate insulation layer, and the insulating interlayer that are formed on the transmission area.

The layers included in the transmitting layer structure may be merged with each other to have a single-layered structure.

The transparent display substrate may further include a buffer layer between the barrier layer and the gate insulation layer, wherein the barrier layer and the buffer layer consist essentially of silicon oxynitride.

At least one of the barrier layer, the buffer layer, the gate insulation layer, and the insulating interlayer may include silicon oxynitride and may include a relative vertical concentration gradient of oxygen and nitrogen.

The buffer layer may be richer in nitrogen at an interface with the barrier layer, and may be richer in oxygen at an interface with the gate insulation layer.

The gate insulation layer may be richer in oxygen at an interface with the buffer layer, and may be richer in nitrogen at an interface with the insulating interlayer.

The transparent display substrate may further include a buffer layer between the base substrate and the pixel circuit. The buffer layer may consist essentially of silicon oxynitride. The transmitting layer structure may include a portion of the buffer layer formed on the transmission area.

The embodiments may be realized by providing a transparent display device including a base substrate including a pixel area and a transmission area; a pixel circuit on the pixel area of the base substrate; a pixel electrode selectively disposed on the pixel area of the base substrate, the pixel electrode being electrically connected to the pixel circuit; a display layer on the pixel electrode; an opposing electrode facing the pixel electrode on the display layer; a transmitting layer structure selectively disposed on the transmission area of the base substrate, the transmitting layer structure including at least an inorganic material, the inorganic material consisting essentially of silicon oxynitride; and a transmitting window defined on the transmission area of the base substrate, a top surface of the transmitting layer structure being exposed through the transmitting window.

The transparent display device may further include a barrier layer between the base substrate and the pixel circuit; a gate insulation layer and an insulating interlayer sequentially formed on the barrier layer and partially covering the pixel circuit; a via insulation layer selectively disposed on a portion of the insulating interlayer of the pixel area and covering the pixel circuit; and a pixel defining layer partially covering the pixel electrode on the via insulation layer.

The barrier layer, the gate insulation layer and the insulating interlayer may be commonly provided on the pixel area and the transmission area, and the transmitting layer structure may include portions of the barrier layer, the gate insulation layer and the insulating interlayer formed on the transmission area.

The transmitting window may be defined by sidewalls of the pixel defining layer and the via insulation layer, and a top surface of the insulating interlayer.

The gate insulation layer and the insulating interlayer may be selectively disposed on the pixel area, and the transmitting window may be defined by sidewalls of the pixel defining layer, the via insulation layer, the insulating interlayer, and the gate insulation layer, and a top surface of the barrier layer.

The opposing electrode may be formed along surfaces of the pixel defining layer and the display layer, and a bottom and a sidewall of the transmitting window, and a thickness of a portion of the opposing electrode on the bottom and the sidewall of the transmitting window may be smaller than a thickness of a portion of the opposing electrode on the surfaces of the pixel defining layer and the display layer.

The opposing electrode may be selectively disposed on the pixel area, and may not extend on the transmission area.

The transparent display device may further include a deposition control layer on the transmitting layer structure.

The opposing electrode may be commonly disposed on the pixel area and the transmission area.

A thickness of the opposing electrode on the transmission area may be smaller than a thickness of the opposing electrode on the pixel area.

The transparent display device may further include a buffer layer between the base substrate and the pixel circuit. The buffer layer may consist essentially of silicon oxynitride. The transmitting layer structure may include a portion of the buffer layer formed on the transmission area.

The display layer may include a plurality of layers, and at least one of the plurality of layers may be commonly provided on the pixel area and the transmission area.

The transparent display device may further include an encapsulation layer on the opposing electrode. The encapsulation layer may extend throughout the pixel area and the transmission area.

The embodiments may be realized by providing a method of manufacturing a transparent display device, the method including loading a base substrate in a process chamber, the base substrate including a pixel area and a transmission area; introducing a silicon oxide precursor and a nitrogen source of a variable flow rate in the process chamber to form a barrier layer on the base substrate such that the barrier layer consists essentially of silicon oxynitride; forming a pixel circuit on the barrier layer; forming an insulation layer on the barrier layer such that the insulation layer covers the pixel circuit; forming a pixel electrode on the insulation layer such that the pixel electrode is electrically connected to the pixel circuit; at least partially removing a portion of the insulation layer on the transmission area; forming a display layer on the pixel electrode; and forming an opposing electrode on the display layer.

Forming the barrier layer may include creating a relative concentration gradient of oxygen and nitrogen by adjusting the flow rate of the nitrogen source.

The base substrate may include a polyimide-based resin, the nitrogen source may include a plurality of different nitrogen containing gases, and forming the barrier layer may include adjusting a relative flow rate of the nitrogen containing gases such that a refractive index of the barrier layer is consistent with the refractive index of the base substrate.

BRIEF DESCRIPTION OF THE DRAWINGS

Features will be apparent to those of skill in the art by describing in detail exemplary embodiments with reference to the attached drawings in which: \

DETAILED DESCRIPTION

Figure 1:
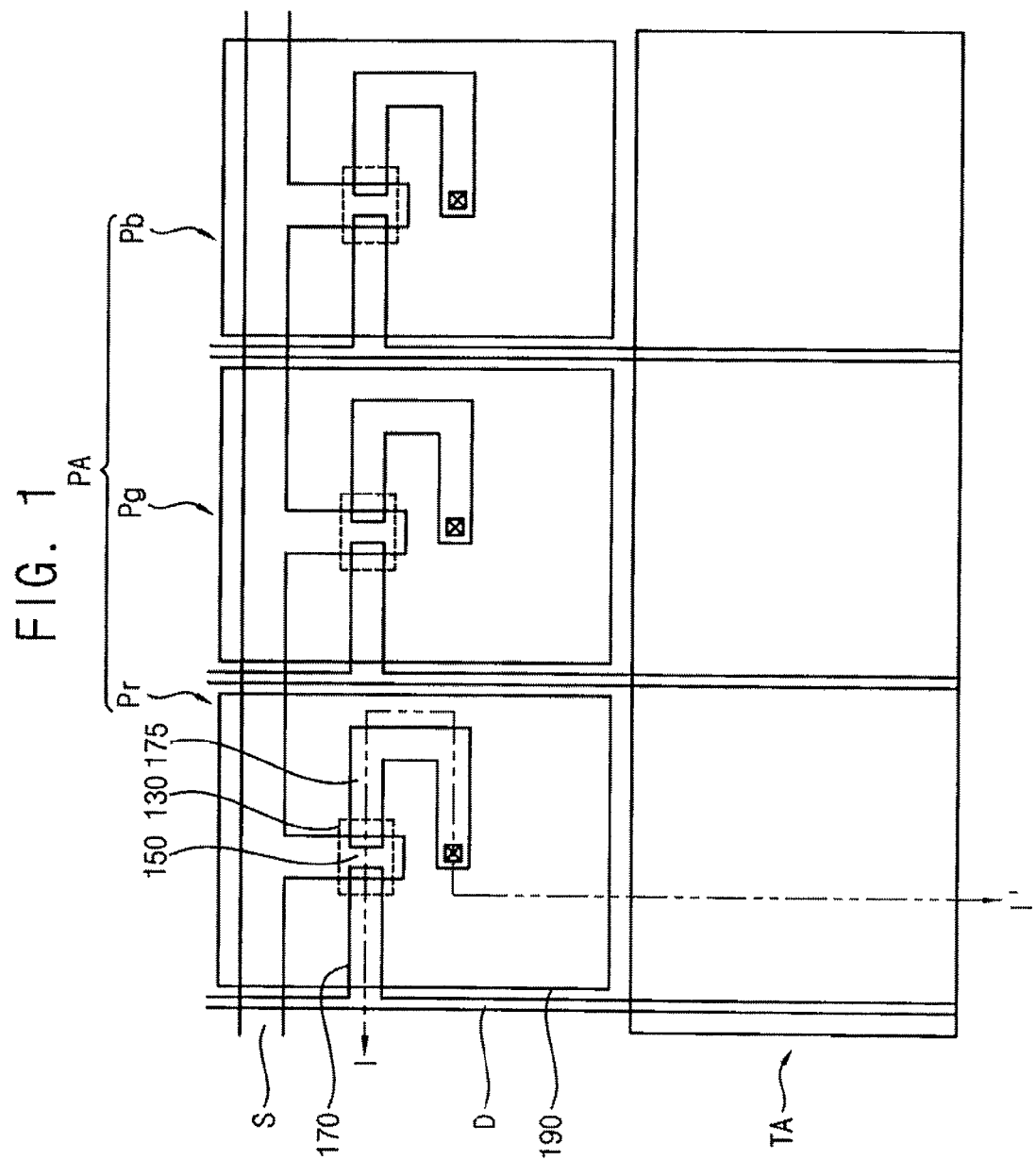
FIG. 1 illustrates a schematic top plan view of a transparent display substrate in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "on" versus "directly on," "between" versus "directly between," "adjacent" versus "directly adjacent," etc.).

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
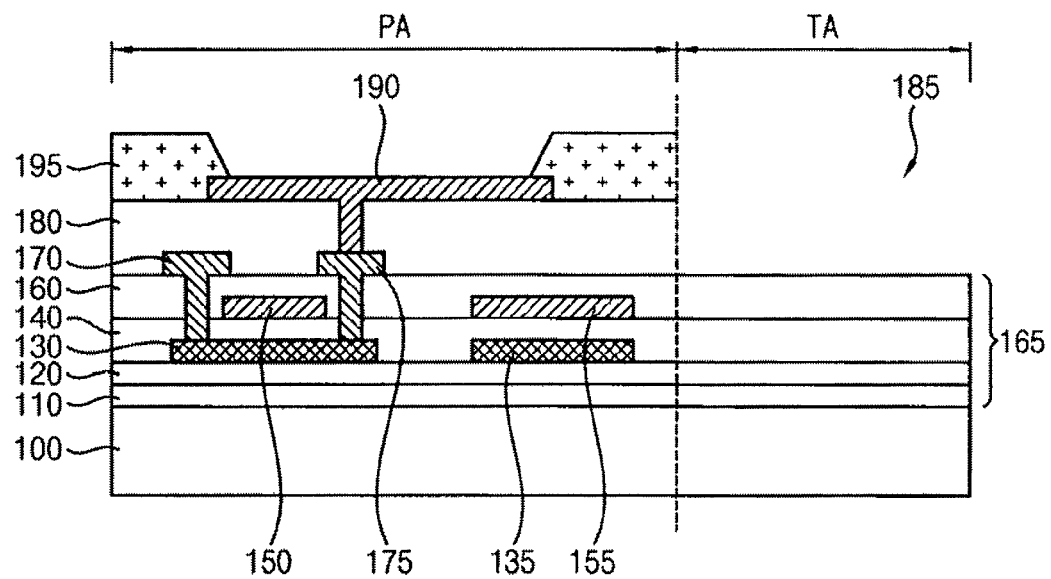
FIGS. 2 and 3 illustrate cross-sectional views of transparent display substrates in accordance with example embodiments.
Figure 3:
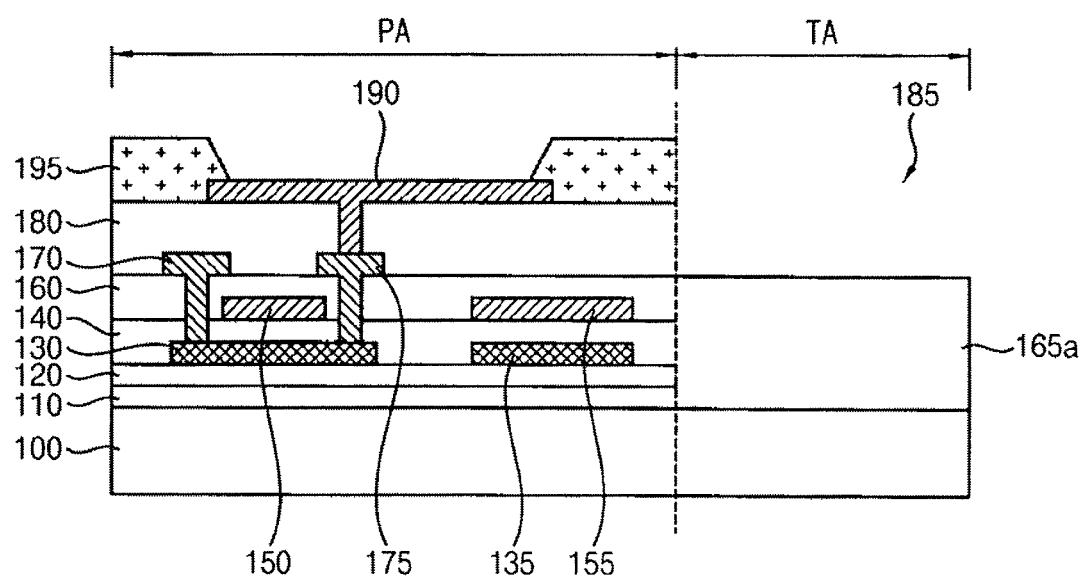

FIG. 1 illustrates a schematic top plan view of a transparent display substrate in accordance with example embodiments. FIGS. 2 and 3 illustrate cross-sectional views of transparent display substrates in accordance with example embodiments. For example, FIGS. 2 and 3 illustrate cross-sectional view taken along a line I-I' of FIG. 1.

Referring to FIGS. 1 and 2, the transparent display substrate may include a pixel area PA and a transmission area TA.

The pixel area PA may include a red pixel Pr, a green pixel Pg, and a blue pixel Pb, which may be adjacent to each other. The transmission area TA may be adjacent to the pixel area PA. As illustrated in FIG. 1, the transmission area TA may continuously extend to be adjacent to the red pixel Pr, the green pixel Pg, and the blue pixel Pb. In an implementation, the transmission area TA may be individually patterned for each pixel.

A transistor (e.g., a thin film transistor: TFT) may be disposed in each pixel, and the transistor may be electrically connected to a data line D and a scan line S. As illustrated in FIG. 1, the data line D and the scan line S may cross each other, and the each pixel may be defined at an intersection region of the data line D and the scan line S. A pixel circuit may be defined by the data line D, the scan line S and the transistor TR.

The pixel circuit may further include a power line that may be parallel to the date line D. Additionally, a capacitor electrically connected to the power line and the transistor may be disposed in each pixel.

FIGS. 1 and 2 illustrate that one transistor is disposed in the each pixel, however, in an implementation, at least two transistors may be disposed in the each pixel. For example, a switching transistor and a driving transistor may be disposed in each pixel. The capacitor may be electrically connected between the switching transistor and the driving transistor.

As illustrated in FIG. 2, the transistor and the capacitor may be disposed on a portion of a buffer layer 120 formed on the pixel area PA of a base substrate 100. The transistor may include a first active pattern 130, a gate insulation layer 140, a first gate electrode 150, an insulating interlayer 160, a source electrode 170, and a drain electrode 175. A via insulation layer 180 may cover the transistor, and a pixel electrode 190 and a pixel defining layer (PDL) 195 may be disposed on the via insulation layer 180.

The capacitor may be defined by a second active pattern 135, the gate insulation layer 140, and a second gate electrode 155 formed on the buffer layer 120.

A transparent insulation substrate may be used as the base substrate 100. For example, the base substrate 100 may include a polymer material having transmitting and flexible properties. In an implementation, the base substrate 100 may include, e.g., a polyimide-based resin.

The base substrate 100 may be divided into or include the pixel area PA and the transmission area TA, as described above.

A barrier layer 110 and the buffer layer 120 may be sequentially formed on the base substrate 100. The barrier layer 110 and the buffer layer 120 may substantially cover an entire top surface of the base substrate 100.

Diffusion of moisture and/or impurities between or from the base substrate 100 to structures thereon may be blocked by the barrier layer 110.

The diffusion of the moisture and/or impurities may be additionally blocked by the buffer layer 120, and a stress from the structures on the base substrate 100 may be buffered or absorbed by the buffer layer 120.

In an implementation, the barrier layer 110 and the buffer layer 120 may include, e.g., silicon oxynitride ($SiO_xN_y$). In an implementation, the barrier layer 110 and the buffer layer 120 may consist essentially of silicon oxynitride. Accordingly, the barrier layer 110 and the buffer layer 120 may have a substantially single composition of silicon oxynitride. In an implementation, the barrier layer 110 and the buffer layer 120 may each consist of silicon oxynitride.

In an implementation, one of the barrier layer 110 and the buffer layer 120 may be omitted. In this case, a substantially single-leveled barrier layer may be formed on the base substrate 100.

An active pattern may be disposed on a portion of the buffer layer 120 on the pixel area PA. The active pattern may include the first active pattern 130 and the second active pattern 135.

The active pattern may include a silicon compound, e.g., polysilicon. In an implementation, a source region and a drain region (including p-type or n-type impurities) may be formed at both ends of the first active pattern 130. The second active pattern 135 may also include the impurities, and the impurities may be distributed throughout the second active pattern 135.

In an implementation, the active pattern may include an oxide semiconductor such as indium gallium zinc oxide (IGZO), zinc tin oxide (ZTO), or indium tin zinc oxide (ITZO).

As illustrated in FIG. 2, the first and second active patterns 130 and 135 may be located substantially on the same level or the same plane.

The gate insulation layer 140 may be formed on the buffer layer 120 to cover the active patterns. In an implementation, the gate insulation layer 140 may have a single-layered structure including silicon oxide, silicon nitride, or silicon oxynitride.

In an implementation, the gate insulation layer 140 may have the single-layered structure consisting essentially of silicon oxynitride, e.g., substantially similar to the structures of the barrier layer 110 and the buffer layer 120. In an implementation, the gate insulation layer may consist of silicon oxynitride.

A gate electrode may be disposed on the gate insulation layer 140. In an implementation, the gate electrode may include the first gate electrode 150 and the second gate electrode 155. The first gate electrode 150 and the second gate electrode 155 may substantially overlap the first active pattern 130 and the second active pattern 135, respectively.

The first gate electrode 150 may be electrically connected to the scan line S. For example, the first gate electrode 150 may be diverged from or may protrude from the scan line S. The first and second gate electrodes 130 and 135 may be disposed on substantially the same level or the same plane.

The gate electrode may include a metal, an alloy, or a metal nitride. For example, the gate electrode may include a metal such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd), or scandium (Sc), an alloy thereof, or a nitride thereof. These may be used alone or in a combination thereof. In an implementation, the gate electrode may include at least two metal layers having different physical properties. For example, the gate electrode may have a double-layered structure such as an Al/Mo structure or a Ti/Cu structure.

The insulating interlayer 160 may be formed on the gate insulation layer 140 to cover the gate electrodes 150 and 155. In an implementation, the insulating interlayer 160 may have a single-layered structure of a substantially single composition including silicon oxide, silicon nitride, or silicon oxynitride. In an implementation, the insulating interlayer 160 may have the single-layered structure consisting essentially of silicon oxynitride, e.g., substantially similar to the structures of the barrier layer 110 and the buffer layer 120. In an implementation, the insulating interlayer 160 may consist of silicon oxynitride.

The source electrode 170 and the drain electrode 175 may be formed through the insulating interlayer 160 and the gate insulation layer 140 to be in contact with the first active pattern 130. The source electrode 170 and the drain electrode 175 may include a metal such as Al, Ag, W, Cu, Ni, Cr, Mo, Ti, Pt, Ta, Nd, or Sc, an alloy thereof, or a nitride thereof. These may be used alone or in a combination thereof. In an implementation, the source electrode 170 and the drain electrode 175 may include at least two different metal layers such as Al and Mo layers.

The source electrode 170 and the drain electrode 175 may be in contact with the source region and the drain region of the first active pattern 130, respectively. In this case, a portion of the first active pattern 130 between the source region and the drain region may serve as a channel through which charges may be transferred.

The source electrode 170 may be electrically connected to the data line D. For example, the source electrode 170 may be diverged from or may protrude from the data line D.

The transistor may be defined by the first active pattern 130, the gate insulation layer 140, the first gate electrode 150, the source electrode 170, and the drain electrode 175. The capacitor may be defined by the second active pattern 135, the gate insulation layer 140, and the second gate electrode 155.

FIG. 2 illustrates that the transistor has a top-gate structure in which the first gate electrode 150 is disposed over the first active pattern 130. However, in an implementation, the transistor may have a bottom-gate structure in which the first gate electrode 150 is disposed under the first active pattern 130.

As illustrated in FIG. 2, the barrier layer 110, the buffer layer 120, the gate insulation layer 140, and the insulating interlayer 160 may extend continuously and commonly on the pixel area PA and the transmission area TA. Accordingly, a transmitting layer structure 165 including portions of the barrier layer 110, the buffer layer 120, the gate insulation layer 140, and the insulating interlayer 160 may be formed on the transmission area TA of the base substrate 100 (on which the transistor, the capacitor, and wirings may not be formed).

According to example embodiments as described above, the barrier layer 110 and the buffer layer 120 may have a substantially single-layered structure consisting essentially of silicon oxynitride. In an implementation, the gate insulation layer 140 and the insulating interlayer 160 may also have a substantially single-layered structure consisting essentially of silicon oxynitride. In this case, the transmitting layer structure 165 may be provided as a single composition layer stack consisting essentially of silicon oxynitride. For example, the transmitting layer structure 165 may consist of silicon oxynitride.

In some other devices, a barrier layer, a buffer layer, a gate insulation layer, or an insulating interlayer (included in a transparent display substrate) may individually have a multi-layered structure of a silicon oxide layer and a silicon nitride layer. For example, the barrier layer or the buffer layer may include the silicon nitride layer for blocking moisture diffusion. However, when a plurality of the silicon nitride layers is stacked, a stress may be increased to cause a deterioration of structures, e.g., the TFT on the transparent display substrate. Thus, the silicon oxide layer may be additionally included for absorbing or buffering the stress generated from the silicon nitride layer.

Accordingly, the silicon oxide layers and the silicon nitride layers may be alternately and repeatedly stacked in the comparative example, and thus a plurality of interfaces between the multiple layers may be formed. For example, when an external light is injected on a transmission area TA, a total reflection or an interference of the light may be caused due to a difference of a refractive index at the interfaces. Thus, a transmittance of the transparent display substrate may be entirely decreased.

However, according to example embodiments, the barrier layer 110 and the buffer layer 120 may have the substantially single-layered structure of the single composition consisting essentially of silicon oxynitride. Thus, the number of an interface between different layers may be decreased, and a variation of a refractive index caused by different layer compositions or materials may be reduced and/or prevented. Therefore, a transmittance on the transmission area TA may be improved.

Additionally, the barrier layer 110 and the buffer layer 120 may include a silicon oxynitride layer, and thus may have both advantages of silicon oxide and silicon nitride. For example, the barrier layer 110 and the buffer layer 120 may provide a sufficient suppression of a diffusion of moisture and/or impurities while preventing an excessive stress.

In an implementation, the gate insulation layer 140 and the insulating interlayer 160 may also have the single-layered structure consisting essentially of silicon oxynitride. Thus, the transmittance on the transmission area TA may be more enhanced.

In an implementation, the barrier layer 110, the buffer layer 120, the gate insulation layer 140, and/or the insulating interlayer 160 may include silicon oxynitride ($SiO_xN_y$), and each may include a vertical concentration gradient. Accordingly, values of "x" and "y" in each of these layer may be changed along a vertical direction, e.g., along a thickness direction or a direction extending away from a plane of the base substrate 100.

For example, in the buffer layer 120, a portion adjacent to a top surface of the barrier layer 110 may include a relatively nitrogen-rich composition (e.g., y is greater than x or an amount of nitrogen in the silicon oxynitride is greater than an amount of oxygen in the silicon oxynitride). Thus, the diffusion of moisture and/or impurities at an interface with the barrier layer 110 may be effectively suppressed.

A portion of the buffer layer 120 adjacent to the gate insulation layer 140 may include a relatively oxygen-rich composition (e.g., x is greater than y or an amount of oxygen in the silicon oxynitride is greater than an amount of nitrogen in the silicon oxynitride). Thus, a stress generated from the active patterns 130 and 135 may be effectively absorbed.

For example, in the gate insulation layer 140, a portion adjacent to the buffer layer 120 or the active patterns 130 and 135 may include a relatively oxygen-rich composition (e.g., x is greater than y). Thus, consistency with an upper portion of the buffer layer 120 and a stress may be effectively absorbed.

A portion of the gate insulation layer 140 adjacent to the insulating interlayer 160 or the gate electrodes 150 and 155 may include a relatively nitrogen-rich composition (e.g., y is greater than x). Thus, a diffusion of impurities between the gate electrodes 150 and 155 and the active patterns 130 and 135 may be suppresses.

If the base substrate 100 includes the polyimide-based resin, the base substrate 100 may have a refractive index of about 1.7. In an implementation, the barrier layer 110 and the buffer layer 120 may include silicon oxynitride having a refractive index ranging from about 1.6 to about 1.8. Thus, a total reflection of light due to a, e.g., drastic or substantial, change of or difference in the refractive index may be avoided, so that a transmittance of the transparent display substrate may be improved.

In an implementation, the gate insulation layer 140 and the insulating interlayer 160 may also include silicon oxynitride having a refractive index ranging from about 1.6 to about 1.8. Thus, the transmitting layer structure 165 on the transmission area TA may be adjusted as a single composition having the refractive index of the above range so that the transmittance may be maximized.

The via insulation layer 180 may be formed on the insulating interlayer 160 to cover the source electrode 170 and the drain electrode 175. A via structure through which the pixel electrode 190 and the drain electrode 175 are electrically connected to each other may be accommodated in the via insulation layer 180. In an implementation, the via insulation layer 180 may substantially serve as a planarization layer.

For example, the via insulation layer 180 may include an organic material such as polyimide, an epoxy-based resin, an acryl-based resin, polyester, or the like.

In an implementation, the via insulation layer 180 may be selectively disposed on the pixel area PA, and may not extend on to the transmission area TA. Accordingly, the organic material different from a material included in the transmittance structure 165 may substantially not be present on the transmission area TA. Thus, a reduction of the transmittance by the via insulation layer 165 may be reduced and/or prevented.

The pixel electrode 190 may be disposed on the via insulation layer 180, and may include the via structure electrically connected to the drain electrode 175 through the via insulation layer 180.

In an implementation, the pixel electrode 190 may be individually disposed on the each pixel.

In an implementation, the pixel electrode 190 may serve as a reflective electrode.

In this case, the pixel electrode 190 may include a metal such as Al, Ag, W, Cu, Ni, Cr, Mo, Ti, Pt, Ta, Nd or Sc, or an alloy thereof.

In an implementation, the pixel electrode 190 may include a transparent conductive material having a high work function. For example, the first electrode 190 may include indium tin oxide (ITO), indium zinc oxide (IZO), zinc oxide, or indium oxide.

In an implementation, the pixel electrode 190 may have a multi-layered structure including the transparent conductive material and the metal.

The pixel defining layer (PDL) 195 may be formed on the via insulation layer 180. The PDL 195 may cover a peripheral portion of the first electrode 190. The PDL 195 may include, e.g., a transparent organic material such as a polyimide-based resin or an acryl-based resin.

In an implementation, the PDL 195 may be selectively disposed on a portion of the via insulation layer 180 on the pixel area PA, and may at least partially expose the first electrode 190. The PDL 195 may substantially not extend on the transmission area TA. In an implementation, sidewalls of the PDL 195 and the via insulation layer 180 may extend on substantially the same plane.

In an implementation, a transmitting window 185 may be defined by the sidewalls of the PDL 195 and the via insulation layer 180, and a top surface of the transmitting layer structure 165.

In an implementation, the barrier layer 110 may be directly between the base substrate and the buffer layer 120, and may consist essentially of or consist of silicon oxynitride. In an implementation, the buffer layer 120 may be directly between the barrier layer 110 and the gate insulation layer 140, and may consist essentially of or consist of silicon oxynitride. In an implementation, the gate insulation layer 140 may be directly between the buffer layer 120 and the insulating interlayer 160, and may consist essentially of or consist of silicon oxynitride. In an implementation, the insulating interlayer 160 may be directly between the gate insulation layer 140 and the via insulation layer 180, and may consist essentially of or consist of silicon oxynitride. In an implementation, the transmitting structure on the transmission area TA of the base substrate 100 may include separate, discontinuous layers, or may include a monolithic, continuous layer (e.g., the layers may be merged with each other). The separate and discontinuous layers of the transmitting structure may all consist essentially of or consist of silicon oxynitride, and may include different concentrations of oxygen and nitrogen in the silicon oxynitride. For example, one layer of the transmitting structure may include, consist essentially of, or consist of silicon oxynitride having a different ratio of oxygen to nitrogen relative to another layer of the transmitting structure, which also includes or consists of silicon oxynitride. The monolithic and continuous layer of the transmitting structure may include, consist essentially of, or consist of silicon oxynitride, but may include different regions or portions therein having different relative concentrations of oxygen to nitrogen in the silicon oxynitride. For example, one portion of the monolithic transmitting structure may have a first ratio of oxygen to nitrogen in the silicon oxynitride thereof and another portion of the monolithic transmitting structure may have a second ratio of oxygen to nitrogen in the silicon oxynitride thereof, and the second ratio may be different from the first ratio. For example, in the monolithic transmitting structure, regions of different ratios of oxygen to nitrogen in the overall structure of silicon oxynitride may not be separated by distinct or discontinuous interfaces. For example, because the transmitting structure on the transmission area TA consists essentially of silicon oxynitride, a refractive index of the transmission area may be relatively constant, and an overall transmittance of a device including such a structure may be improved, relative to a device including a transmitting structure that does not consist essentially of silicon oxynitride. For example, the layer consisting essentially of silicon oxynitride may include another material that does not adversely affect the uniform refractive indices among the layers and/or the overall improvement in transmittance. In an implementation, when a layer or element is described as having a single composition of (e.g., silicon oxynitride), the entire layer or element uniformly consists essentially of or consists of silicon oxynitride, even if there may be some variation of the composition of the silicon oxynitride (e.g., relative amounts of oxygen and nitrogen) in different regions thereof.

Referring to FIG. 3, a transmitting structure 165a on the transmission area TA may have a substantially single composition consisting essentially of silicon oxynitride. Accordingly, the transmitting layer structure 165a may have a substantially single-layered structure. In an implementation, the transmitting structure 165a may consist of silicon oxynitride. In an implementation, the transmitting structure 165a may consist of a single, one-piece, or monolithic layer of silicon oxynitride.

On the pixel area PA, the barrier layer 110, the buffer layer 120, the gate insulation layer 140, and the insulating interlayer 160 may be stacked, and elements included in the pixel circuit such as the active patterns 130 and 135, and the gate electrodes 150 and 155 may be formed. Accordingly, e.g., a thermal treatment and etching processes may be performed on the pixel area PA for the formation of the elements such that interfaces of the barrier layer 110, the buffer layer 120, the gate insulation layer 140, and/or the insulating interlayer 160 may be divided or defined. However, on the transmission area TA, the barrier layer 110, the buffer layer 120, the gate insulation layer 140, and the insulating interlayer 160 of a substantially single composition consisting essentially of silicon oxynitride may be stacked without intervention of other structures or materials, such that the transmitting layer structure 165a may be formed.

Thus, the barrier layer 110, the buffer layer 120, the gate insulation layer 140 and the insulating interlayer 160 on the transmission area TA may be merged with each other such that the transmitting layer structure 165a having the substantially single-layered, one-piece, or monolithic structure may be formed as illustrated in FIG. 3.

Figure 4:
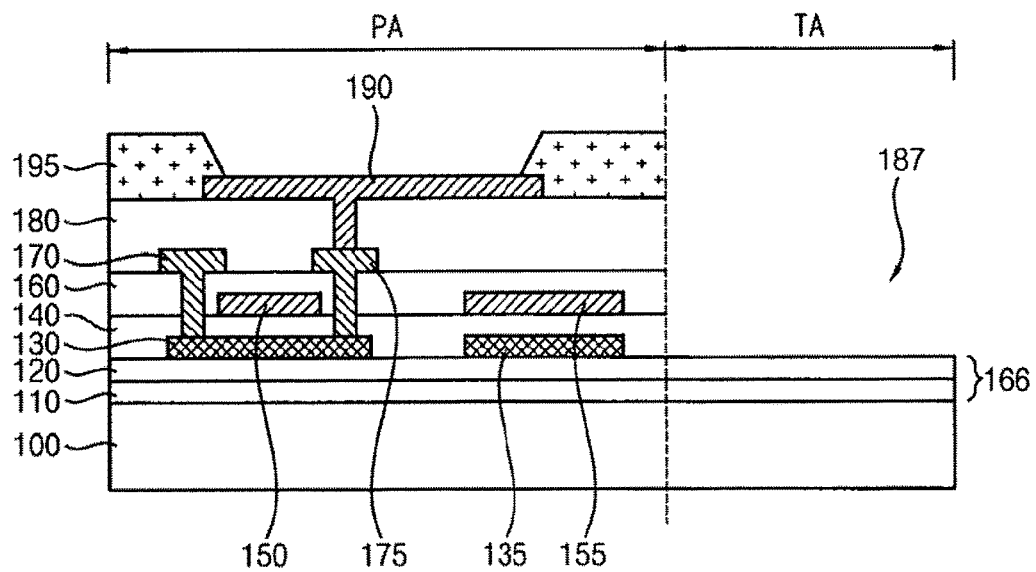
FIGS. 4 and 5 illustrate cross-sectional views of transparent display substrates in accordance with example embodiments.
Figure 5:
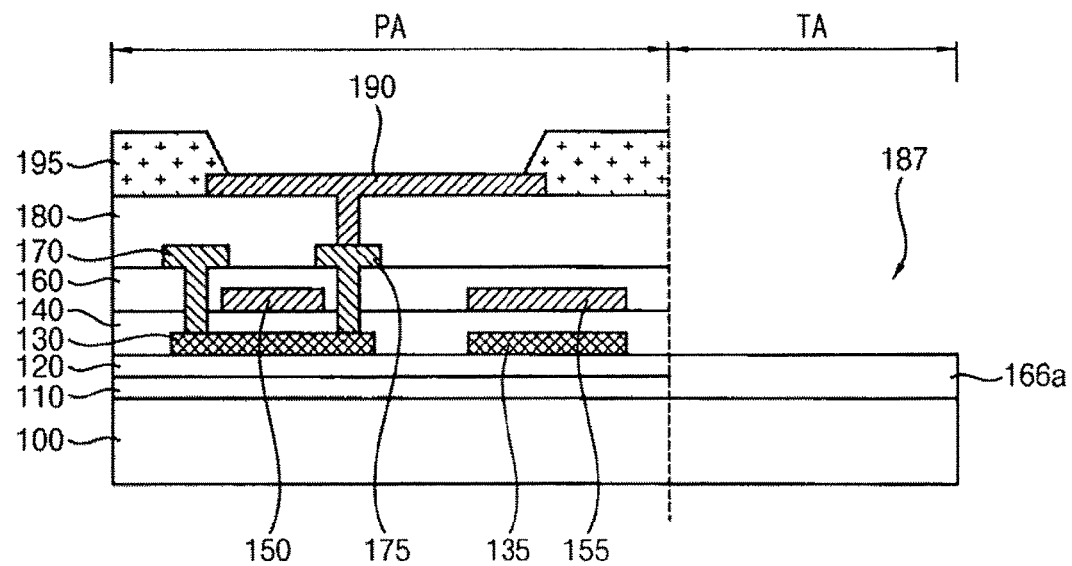

FIGS. 4 and 5 illustrate cross-sectional views of transparent display substrates in accordance with example embodiments.

The transparent display substrates of FIGS. 4 and 5 may have elements and/or constructions substantially the same as or similar to those illustrated with reference to FIGS. 1 to 3, except for a structure of a transmission area TA. Thus, repeated detailed descriptions of elements and structures may be omitted, and like reference numerals are used to designate like elements.

Referring to FIG. 4, the transparent display substrate may include a pixel area PA and a transmission area TA. The pixel area PA of the transparent display substrate may have a structure substantially the same as or similar to that of the pixel area PA illustrated with reference to FIGS. 2 and 3.

A transmitting window 187 may be formed on the transmission area TA of the transparent display substrate. The transmitting window 187 may be defined by sidewalls of a PDL 195, a via insulation layer 180, an insulating interlayer 160, and a gate insulation layer 140, and a top surface of a transmitting layer structure 166.

The transmitting layer structure 166 may include a barrier layer 110 and a buffer layer 120 sequentially stacked on a base substrate 100. In an implementation, one of the barrier layer 110 and the buffer layer 120 may be omitted. In this case, the transmitting layer structure 166 having a substantially single-layered structure may be forming. As described above, the barrier layer 110 and the buffer layer 120 may have a substantially single composition consisting essentially of silicon oxynitride.

The barrier layer 110 and the buffer layer 120 may extend continuously and commonly on the pixel area PA and the transmission area TA.

A gate insulation layer 140, the insulating interlayer 160, and the via insulation layer 180 may be removed on the transmission area TA, and may be selectively disposed on the pixel area PA, e.g., only on the pixel area PA.

In an implementation, sidewalls of the PDL 196, the via insulation layer 180, the insulating interlayer 160, and the gate insulation layer 140 may extend on substantially the same plane, and may define the transmitting window 187 together with the top surface of the transmitting layer structure 166.

Referring to FIG. 5, a transmitting layer structure 166a may have a substantially single-layered structure. As described with reference to FIG. 3, insulation layers on the pixel area PA may be divided or defined individually by processes for the formation of, e.g., a TFT. However, the barrier layer 110 and the buffer layer 120 may be substantially merged or continuous with each other (e.g., monolithic) such that the transmitting layer structure 166a of the substantially single-layered structure may be formed.

According to example embodiments as described above, portions of the insulating interlayer 160 and the gate insulation layer 140 on the transmission area TA may be removed such that the transmitting window 187 may be expanded more than the transmitting window 185 of FIGS. 2 and 3. Thus, a transmittance on the transmission area TA may be more enhanced. Further, the transmitting layer structures 166 and 166a may have a single composition or a single-layered structure consisting essentially of silicon oxynitride. Thus, a reduction of the transmittance on the transmission area TA due to a total reflection or an interference of light may be minimized.

Figure 6:
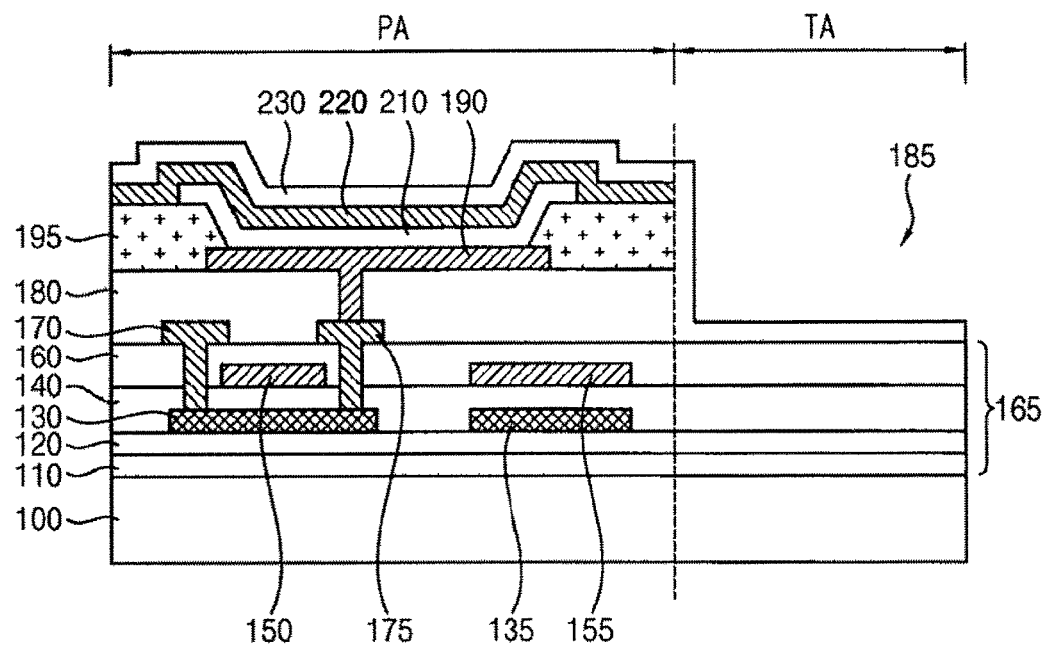
FIGS. 6 and 7 illustrate cross-sectional views of transparent display devices in accordance with example embodiments.
Figure 7:
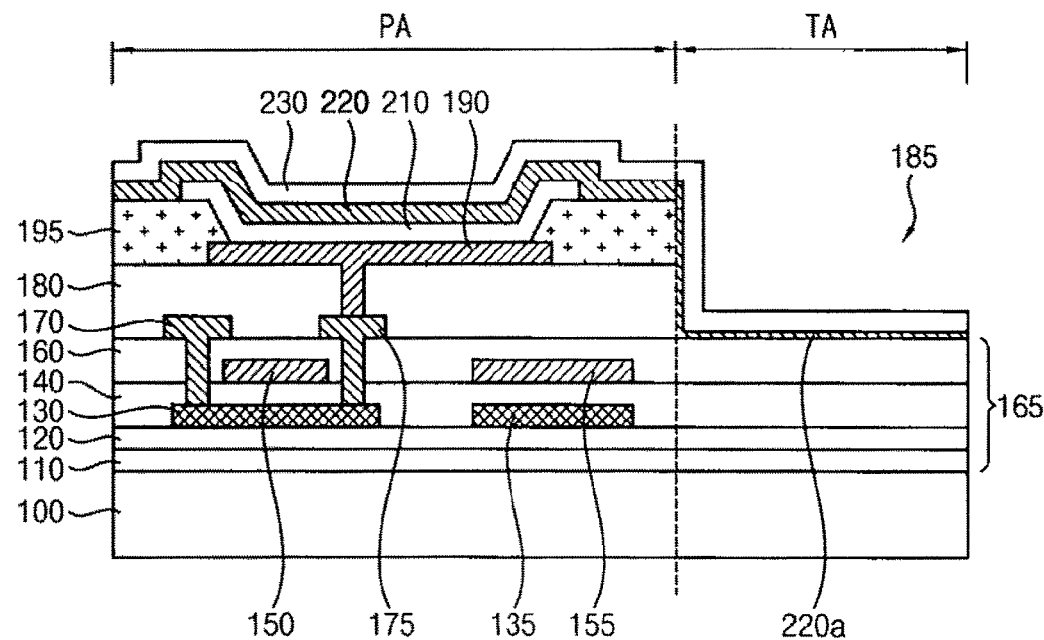

FIGS. 6 and 7 illustrate cross-sectional views of transparent display devices in accordance with example embodiments. For example, FIGS. 6 and 7 illustrate organic light emitting display (OLED) devices including the transparent display substrates illustrated with reference to FIGS. 1 to 3.

Repeated detailed descriptions of elements and/or structures that are substantially the same as or similar to those illustrated with reference to FIGS. 1 to 3 may be omitted.

Referring to FIG. 6, the transparent display device may include a display layer 210, an opposing electrode 220, and an encapsulation layer 230 sequentially stacked on the transparent display substrate.

The display layer 210 may be disposed on a PDL 195 and a pixel electrode 190. The display layer 210 may be individually patterned on each pixel. For example, the display layer 210 may include an organic emitting layer provided individually on a red pixel Pr, a green pixel Pg, and a blue pixel Pb for generating different colors of light, e.g., a red color of light, a green color of light, or a blue color of light. The organic emitting layer may include a host material excited by holes and electrons, and a dopant material for facilitating an absorbance and a release of energy and improving a light emitting efficiency.

In an implementation, the display layer 210 may further include a hole transport layer (HTL) interposed between the pixel electrode 190 and the organic emitting layer. The display layer 210 may further include an electron transport layer (ETL) interposed between the opposing electrode 220 and the organic emitting layer.

The HTL may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum ($Alq_3$), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or a combination thereof.

In an implementation, the display layer 210 may include a liquid crystal layer instead of the organic emitting layer. In this case, the transparent display device may serve as a liquid crystal display (LCD) device.

The display layer 210 may be formed on a sidewall of the PDL 195 and on a top surface of the pixel electrode 190 exposed by the PDL 195, and may extend partially on a top surface of the PDL 195. In an implementation, the display layer 210 may be confined by the sidewall of the PDL 195 to be individually disposed on the each pixel.

In an implementation, the HTL and/or the ETL included in the display layer 210 may be provided continuously and commonly on a plurality of the pixels.

The opposing electrode 220 may be disposed on the PDL 195 and the display layer 210. The opposing electrode 220 may face the pixel electrode 190 with respect to the display layer 210.

In an implementation, the opposing electrode 220 may serve as a common electrode provided commonly on the plurality of the pixels. The pixel electrode 190 and the opposing electrode 220 may serve as an anode and a cathode of the transparent display device, respectively.

The opposing electrode 220 may include a metal having a low work function such as Al, Ag, W, Cu, Ni, Cr, Mo, Ti, Pt, Ta, Nd or Sc, or an alloy thereof.

As illustrated in FIG. 6, the display layer 210 and the opposing electrode 220 may be selectively disposed on the pixel area PA, and may substantially not extend on the transmission area TA. Thus, a transmitting layer structure 165 may only be exposed by the transmitting window 185, and a reduction of a transmittance on the transmission area TA may be minimized.

As described above, the display layer 210 may include a plurality of layers (e.g., the organic emitting layer, the HTL and the ETL). In an implementation, at least one of the plurality of layers (e.g., the HTL and the ETL) may be commonly provided on the pixel area PA and the transmission area TA.

In an implementation, the transmitting layer structure may have a substantially single-layered structure as illustrated in FIG. 3.

The encapsulation layer 230 may extend continuously on the pixel area PA and the transmission area TA to cover the opposing electrode 220 and the transmitting layer structure 165.

The encapsulation layer 230 may include an inorganic material, e.g., silicon nitride and/or a metal oxide. In an implementation, the encapsulation layer 230 may include silicon oxynitride substantially the same as or similar to a composition of the transmitting layer structure 165. Accordingly, a layer composition on the transmission area TA may be unified, and thus a reduction of a transmittance by a total reflection or an interference of light may be minimized.

In an implementation, a capping layer may be interposed between the opposing electrode 220 and the encapsulation layer 230. The capping layer may include an organic material such as a polyimide resin, an epoxy resin, an acryl resin, or an inorganic material such as silicon oxide, silicon nitride, or silicon oxynitride.

Referring to FIG. 7, the opposing electrode 220 may extend continuously and commonly on the pixel area PA and the transmission area TA. In this case, the opposing electrode 220 may be formed conformally on top surfaces of the PDL 195 and the display layer 210, and on a sidewall and a bottom of the transmitting window 185.

In an implementation, a thickness of an opposing electrode 220a on the transmission area TA may be smaller than a thickness of the opposing electrode 220 on the pixel area PA. For example, as illustrated in FIG. 7, the opposing electrode 220a may be formed on the sidewall and the bottom of the transmitting window 185 to have a smaller thickness than that on the pixel area PA. Accordingly, a reduction of a transmittance by the opposing electrode 220a may be prevented.

The encapsulation layer 230 may be formed on the opposing electrode 220 and 220a to cover both the pixel area PA and the transmission area TA.

Figure 8:
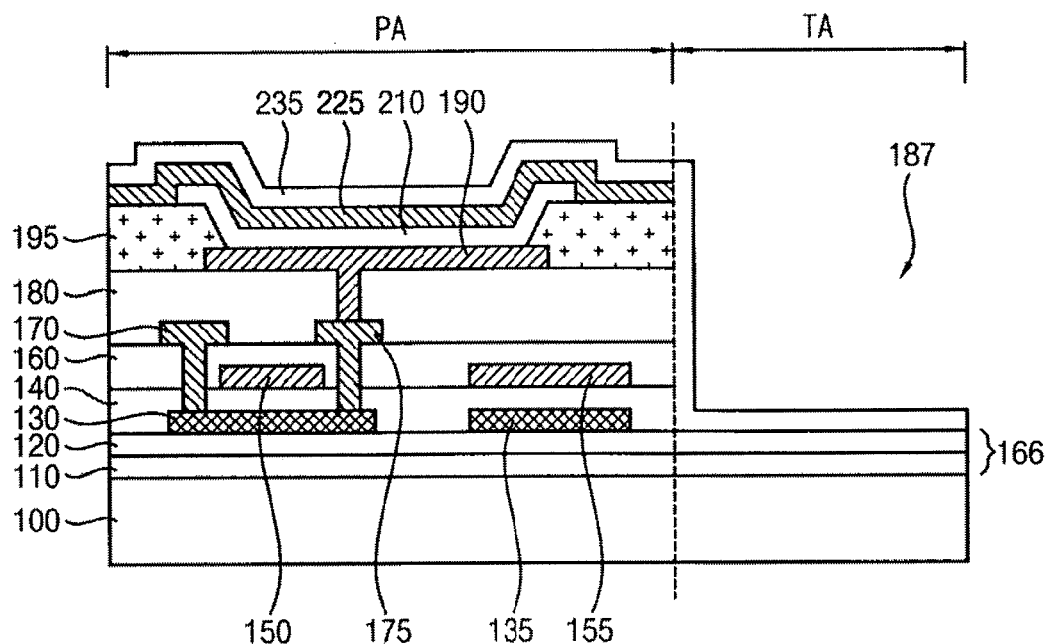
FIGS. 8 and 9 illustrate cross-sectional views of transparent display devices in accordance with example embodiments.
Figure 9:
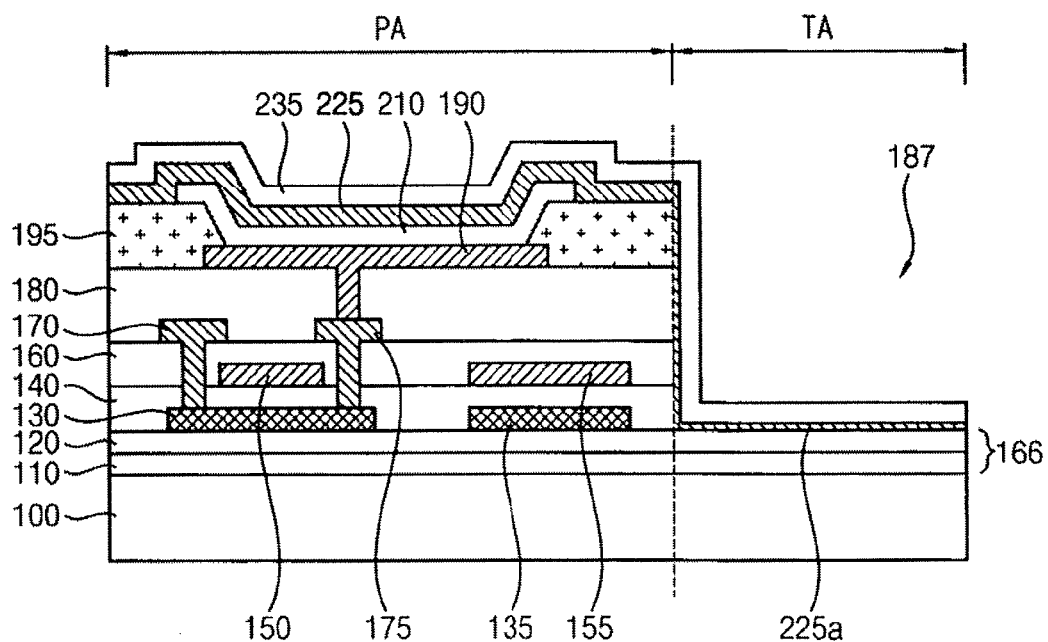

FIGS. 8 and 9 illustrate cross-sectional views of transparent display devices in accordance with example embodiments. For example, FIGS. 8 and 9 illustrate OLED devices including the transparent display substrates of FIGS. 4 and 5.

Repeated detailed descriptions of structures and/or elements that substantially the same as or similar to those illustrated with reference to FIGS. 4 and 5, or FIGS. 6 and 7 may be omitted.

Referring to FIG. 8, a display layer 210 and an opposing electrode 225 may be selectively disposed on a pixel area PA of the transparent display device. The display layer 210 may be individually disposed on a pixel electrode 190 of each pixel. The opposing electrode 225 may cover the PDL 195, the pixel electrodes 190, and the display layers 210 of a plurality of the pixels and may not extend on a transmission area TA.

A transmitting window 187 may be formed on the transmission area TA. In an implementation, portions of a via insulation layer 180, an insulating interlayer 160, and a gate insulation layer 140 on the transmission area TA may be removed. Accordingly, the transmitting window 187 may be defined by sidewalls of the PDL 195, the via insulation layer 180, the insulating interlayer 160, and the gate insulation layer 140 which may extend on substantially the same plane, and a top surface of a transmitting layer structure 166 including a buffer layer 120 and a barrier layer 110.

An encapsulation layer 235 may cover the opposing electrode 225 on the pixel area PA, and may be formed conformally on a sidewall and a bottom of the transmitting window 187.

In an implementation, the barrier layer 110 and the buffer layer 120 may be merged with each other as illustrated in FIG. 5 such that the transmitting layer structure may have a substantially single-layered structure.

In an implementation, the encapsulation layer 235 may include silicon oxynitride. In this case, consistency with the transmitting layer structure 166 may be improved, and a transmittance on the transmission area TA may be further enhanced.

Referring to FIG. 9, an opposing electrode 225 may extend continuously and commonly on the pixel area PA and the transmission area TA. In an implementation, an opposing electrode 225a on the transmission area TA may have a smaller thickness than that of the opposing electrode 225 on the pixel area PA such that a reduction of a transmittance on the transmission area TA may be prevented. An encapsulation layer 235 may cover the opposing electrode 225 and may protect both the pixel area PA and the transmission area TA.

According to example embodiments as described above, the transmitting layer structure 166 may be remained on the transmission area TA to have a minimum thickness for blocking a diffusion of moisture and impurities. Further, a structure of the opposing electrode 225 may be properly adjusted such that the transmittance on the transmission area TA may be maximized.

Figure 10:
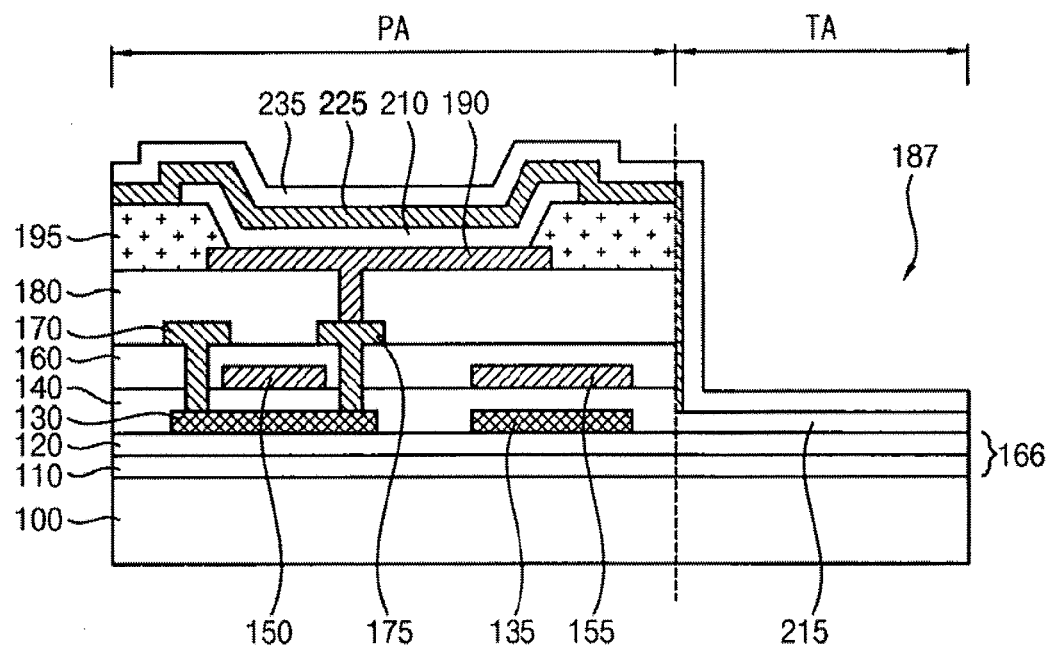
FIG. 10 illustrates a cross-sectional view of a transparent display device in accordance with some example embodiments.

FIG. 10 illustrates a cross-sectional view of a transparent display device in accordance with some example embodiments. Repeated detailed descriptions of elements and/or structures substantially the same as or similar to those illustrated with reference to FIGS. 6 to 9 may be omitted.

Referring to FIG. 10, the transparent display device may further include a deposition control layer 215 formed on a transmitting layer structure 166 defined on a transmission area TA. The deposition control layer 215 may include a material having an affinity and/or an adhesion for a conductive material such as a metal lower than those of a display layer 210 and the transmitting layer structure 166. In an implementation, the deposition control layer 215 may include a non-light emitting organic material. For example, the deposition control layer 215 may include, e.g., N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbarzol-3-yl)phenyl)-9H-fluorene-2-amine, 2-(4-(9,10-di(naphthalen-2-yl)anthracen-2-yl)phenyl)-1-phenyl-1H-benzo-[D]imidazole, etc.

In this case, an opposing electrode 225 may cover a PDL 195 and the display layer 210 on the transmission area TA, and may be formed only on a sidewall of a transmitting window 187 on the transmission area TA. A thickness of a portion of the opposing electrode 225 formed on the sidewall of the transmitting window 187 may have a relatively small thickness. The electrode 225 may not be formed on a top surface of the deposition control layer 215. Accordingly, a transmittance on the transmission area TA may be improved by an omission of the opposing electrode 225 on the transmission area TA.

FIGS. 11 to 17B illustrate cross-sectional views of stages in a method of manufacturing a transparent display device in accordance with example embodiments.

Figure 11:
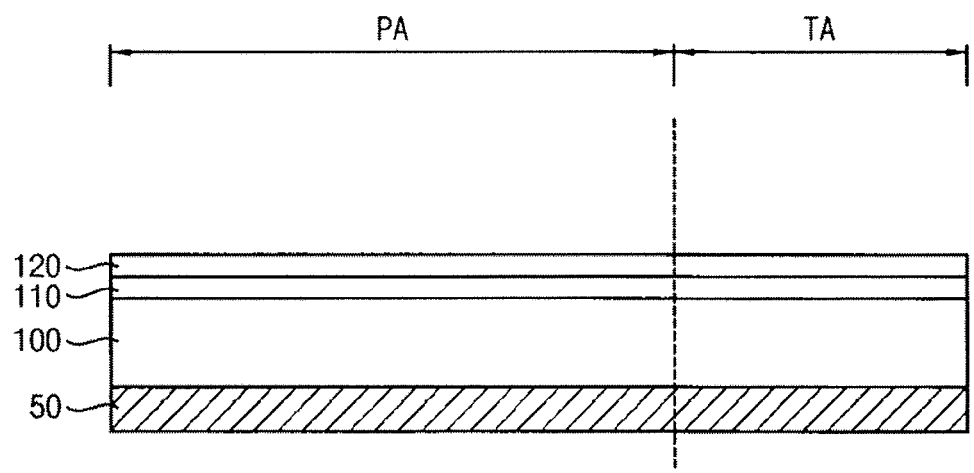
FIGS. 11 to 17B illustrate cross-sectional views of stages in a method of manufacturing a transparent display device in accordance with example embodiments.

Referring to FIG. 11, a base substrate 100 may be formed on a carrier substrate 50, and a barrier layer 110 and a buffer layer 120 may be sequentially formed on the base substrate 100. The base substrate 100 may be divided into a pixel area PA and a transmission area TA, and the barrier layer 110 and the buffer layer 120 may be formed continuously on the pixel area PA and the transmission area TA.

The carrier substrate 50 may serve as a supporter of the base substrate 100 while performing manufacturing processes of the transparent display device. For example, a glass substrate or a metal substrate may be used as the carrier substrate 50.

The base substrate 100 be formed using a transparent polymer resin, e.g., a polyimide-based resin. For example, a precursor composition containing a polyimide precursor may be coated on the carrier substrate 50 by, e.g., a spin coating process to form a coating layer. The coating layer may be thermally cured to form the base substrate 100.

The polyimide precursor may include diamine and dianhydride. The precursor composition may be prepared by dissolving the polyimide precursor in an organic solvent. The organic solvent may include, e.g., N-methyl-2-pyrrolidone (NMP), dimethylformamide (DMF), tetrahydrofuran (THF), triethylamine (TEA), ethyl acetate, dimethylsulfoxide (DMSO), or an ethylene glycol-based ether solvent. These may be used alone or in a combination thereof.

The organic solvent may be vaporized and a polymerization reaction may be initiated by the thermal curing process to form a polyamic acid structure, and the polyamic acid structure may be further thermally cured such that a condensation reaction may occur to form the polyimide-based resin.

The barrier layer 110 and the buffer layer 120 may be formed of silicon oxynitride. In an implementation, the barrier layer 110 and the buffer layer 120 may consist essentially of silicon oxynitride.

For example, the barrier layer 110 and the buffer layer 120 may be formed by a chemical vapor deposition (CVD) process, a plasma enhanced chemical vapor deposition (PECVD) process, a high density plasma-chemical vapor deposition (HDP-CVD) process, etc.

For example, the base substrate 100, which may be attached to the carrier substrate 50, may be loaded in a deposition process chamber, and a silicon oxide precursor and a nitrogen source may be introduced on the base substrate 100 to form the barrier layer 110 and the buffer layer 120.

The silicon oxide precursor may include, e.g., tetraethyl orthosilicate (TEOS) or plasma enhanced oxide (PEOX). The nitrogen source may include ammonia ($NH_3$), nitrous oxide ($N_2O$), or the like.

In an implementation, a silicon source and an oxygen source may be individually introduced in the deposition process chamber instead of the silicon oxide precursor. For example, the silicon source may include silane ($SiH_4$), disilane ($Si_2H_6$), dichlorosilane ($SiH_2Cl_2$), or the like. The oxygen source may include, e.g., oxygen ($O_2$) or ozone ($O_3$).

In an implementation, a flow rate of the nitrogen source may be controlled so that a relative vertical concentration gradient of oxygen and nitrogen may be created in the barrier layer 110 and/or the buffer layer 120.

For example, while forming the buffer layer 120, the silicon oxide precursor (or the silicon source and the oxygen source) and the nitrogen source may be introduced together in the deposition process chamber, and then the flow rate of the nitrogen source may be gradually decreased. Accordingly, a content of nitrogen may be gradually decreased from an interface between the buffer layer 120 and the barrier layer 110 to a top surface of the buffer layer 120. Thus, a lower portion of the buffer layer 120 may include a relatively nitrogen-rich silicon oxynitride, and an upper portion of the buffer layer 120 may include a relatively oxygen-rich silicon oxynitride.

In an implementation, the nitrogen source may include different kinds of nitrogen containing gas. In an implementation, $NH_3$ and $N_2O$ may be used together as the nitrogen source. Further, a flow rate ratio of $NH_3$ to $N_2O$ ($NH_3/N_2O$) may be controlled such that a refractive index of the barrier layer 110 and/or the buffer layer 120 may be adjusted.

For example, if the base substrate 100 includes a polyimide-based resin, a refractive index of the base substrate 100 may be about 1.7. The flow rate ratio may be controlled such that the barrier layer 110 and/or the buffer layer 120 may have a refractive index ranging from about 1.6 to about 1.8 to improve an optical consistency with the base substrate 100.

In an implementation, the flow rate ratio of $NH_3$ to $N_2O$ may be controlled in a range of about 1 to about 5. In an implementation, the flow rate ratio may be controlled in a range of about 1.5 to about 3.

In an implementation, one of the barrier layer 110 and the buffer layer 120 may be omitted. Thus, a single-layered barrier layer having a substantially single composition of silicon oxynitride may be formed on the base substrate 100.

In an implementation, the barrier layer 110 and the buffer layer 120 may have substantially the same composition to be substantially merged with each other. Thus, a single-layered barrier layer having a substantially single composition of silicon oxynitride may be formed on the base substrate 100.

Figure 12:
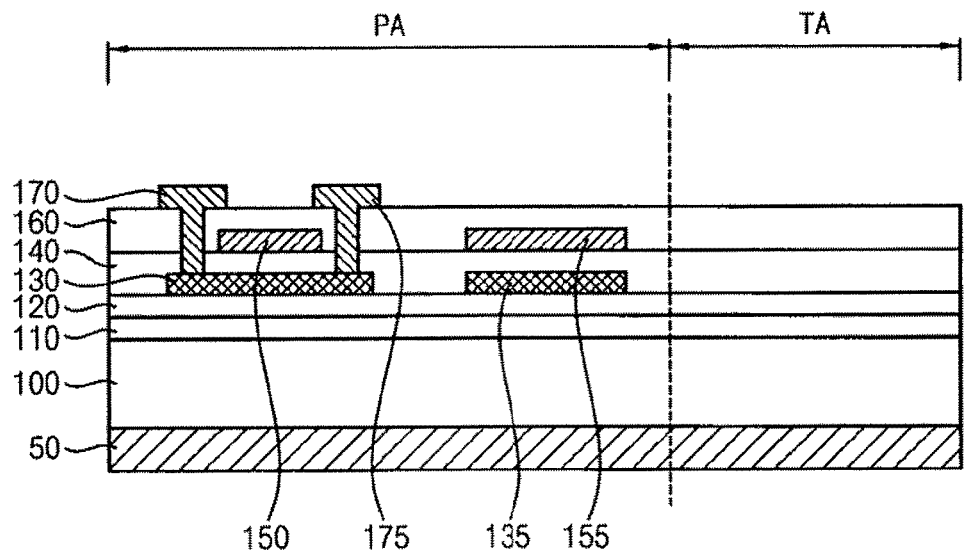

Referring to FIG. 12, additional insulation layers and a pixel circuit may be formed on the buffer layer 120.

First and second active patterns 130 and 135 may be formed on the buffer layer 120.

In an implementation, a semiconductor layer may be formed on the buffer layer 120 using amorphous silicon or polysilicon, and then may be patterned to form the first and second active patterns 130 and 135.

In an implementation, a crystallization process such as a low temperature polycrystalline silicon (LTPS) or a laser crystallization process may be performed after the formation of the semiconductor layer.

In an implementation, the semiconductor layer may be formed of an oxide semiconductor such as IGZO, ZTO or ITZO.

A gate insulation layer 140 covering the active patterns 130 and 135 may be formed on the buffer layer 120, and gate electrodes 150 and 155 may be formed on the gate insulation layer 140.

For example, a first conductive layer may be formed on the gate insulation layer 140, and may be etched by, e.g., a photolithography process to form a first gate electrode 150 and a second gate electrode 155. The first gate electrode 150 and the second gate electrode 155 may substantially overlap the first active pattern 130 and the second active pattern 135, respectively, with respect to the gate insulation layer 140.

The first conductive layer may be formed using a metal, an alloy, or a metal nitride. The first conductive layer may be formed by depositing a plurality of metal layers.

The gate electrodes 150 and 155 may be formed simultaneously with a scan line S (see FIG. 1). For example, the gate electrodes 150 and 155, and the scan line S may be formed from the first conductive layer by substantially the same etching process. The scan line S may be integrally connected to the first gate electrode 150.

In an implementation, impurities may be implanted into the first active pattern 130 using the first gate electrode 150 as an ion-implantation mask such that a source region and a drain region may be formed at both ends of the first active pattern 130.

An insulating interlayer 160 covering the gate electrodes 150 and 155 may be formed on the gate insulation layer 140. A source electrode 170 and a drain electrode 175 may be formed through the insulating interlayer 160 and the gate insulation layer 140 to be in contact with the first active pattern 130.

For example, the insulating interlayer 160 and the gate insulation layer 140 may be partially etched to form contact holes through which the first active pattern 130 may be partially exposed. A second conductive layer filling the contact holes may be formed on the insulating interlayer 160, and then may be patterned by a photolithography process to form the source electrode 170 and the drain electrode 175.

In an implementation, the source electrode 170 and the drain electrode 175 may be in contact with the source region and the drain region, respectively. The source electrode 170 may be integrally connected to a data line D (see FIG. 1). In this case, the source electrode 170, the drain electrode 175, and the data line D may be formed from the second conductive layer by substantially the same etching process.

The second conductive layer may be formed using a metal, an alloy, or a metal nitride. The second conductive layer may be formed by depositing a plurality of metal layers.

The gate insulation layer 140 and the insulating interlayer 160 may be formed using an inorganic material such as silicon oxide, silicon nitride, or silicon oxynitride.

In an implementation, the gate insulation layer 140 and/or the insulating interlayer 160 may be formed from a material and a process substantially the same as or similar to those for the barrier layer 110 and/or the buffer layer 120. Accordingly, the gate insulation layer 140 and/or the insulating interlayer 160 may be formed of silicon oxynitride. In an implementation, the gate insulation layer 140 and/or the insulating interlayer 160 may consist essentially of silicon oxynitride.

As described above, a flow rate of the nitrogen source may be controlled so that a relative vertical concentration gradient of oxygen and nitrogen may be created in the gate insulation layer 140 and/or the insulating interlayer 160.

For example, while forming the gate insulation layer 140, the silicon oxide precursor (or the silicon source and the oxygen source) and the nitrogen source may be introduced together in the deposition process chamber, and then the flow rate of the nitrogen source may be gradually increased. Accordingly, a content of nitrogen may be gradually increased from an interface between the buffer layer 120 and the gate insulation layer 140 to a top surface of the gate insulation layer 140. Thus, a lower portion of the gate insulation layer 140 may include a relatively oxygen-rich silicon oxynitride, and an upper portion of the gate insulation layer 140 may include a relatively nitrogen-rich silicon oxynitride.

In an implementation, $NH_3$ and $N_2O$ may be used together as the nitrogen source, and a flow rate ratio of $NH_3$ to $N_2O$ ($NH_3/N_2O$) may be controlled such that a refractive index of the gate insulation layer 140 and/or the insulating interlayer 160 may be adjusted.

For example, the flow rate ratio may be controlled such that the gate insulation layer 140 and/or the insulating interlayer 160 may have a refractive index ranging from about 1.6 to about 1.8. In an implementation, the flow rate ratio of $NH_3$ to $N_2O$ may be controlled in a range of about 1 to about 5. In an implementation, the flow rate ratio may be controlled in a range of about 1.5 to about 3.

The gate insulation layer 140 and the insulating interlayer 160 may be formed commonly and continuously on the pixel area PA and the transmission area TA, and may be stacked on the buffer layer 120.

The first and second conductive layers may be formed by at least one of a CVD process, a PECVD process, an HDP-CVD process, a thermal evaporation process, a sputtering process, an atomic layer deposition (ALD) process and a printing process.

A TFT including the source electrode 170, the drain electrode 175, the first gate electrode 150, the gate insulation layer 140, and the first active pattern 130 may be formed on the pixel area PA. A capacitor including the second active pattern 135, the gate insulation layer 140, and the second gate electrode 155 may be also formed. Accordingly, the pixel circuit including the data line D, the scan line S, the TFT and the capacitor may be formed.

Figure 13:
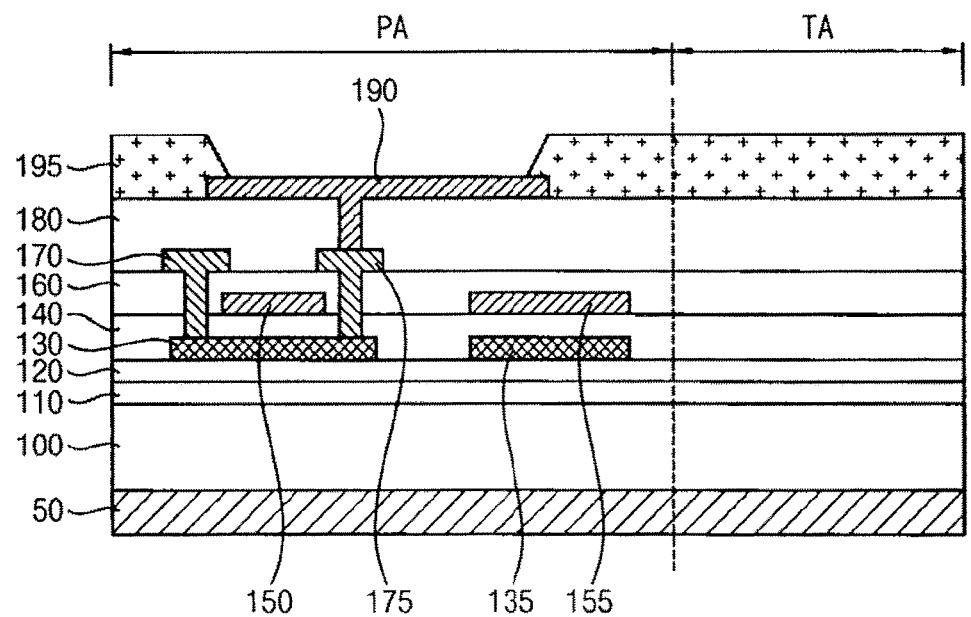

Referring to FIG. 13, a via insulation layer 180 covering the source electrode 170 and the drain electrode 175 may be formed on the insulating interlayer 160.

For example, the via insulation layer 180 may be formed using a transparent organic material such as polyimide, an epoxy-based resin, an acryl-based resin or polyester. The via insulation layer 180 may have a sufficient thickness to have a substantially leveled or planar top surface. The via insulation layer 180 may be formed by a spin coating process or a printing process.

A pixel electrode 190 (electrically connected to the TFT) may be formed on the via insulation layer 180. For example, the via insulation layer 180 may be partially etched to form a via hole through which the drain electrode 175 may be partially exposed.

A third conductive layer (sufficiently filling the via hole) may be formed on the via insulation layer 180 and the exposed drain electrode 175, and then may be patterned to form the pixel electrode 190.

The third conductive layer may be formed using a metal such as Al, Ag, W, Cu, Ni, Cr, Mo, Ti, Pt, Ta, Nd or Sc, or an alloy of the metals by a thermal evaporation process, a vacuum deposition process, a sputtering process, an ALD process, a CVD process, a printing process, etc. In an implementation, the third conductive layer may be formed using a transparent conductive material such as ITO, IZO, zinc oxide or indium oxide.

A PDL 195 may be formed on the via insulation layer 180. The PDL 195 may cover a peripheral portion of the pixel electrode 190 and cover the transmission area TA. A top surface of the pixel electrode 190 may be partially exposed through the PDL 195. A plurality of openings through which the pixel electrode 190 of each pixel is exposed may be defined by the PDL 195. For example, a photosensitive organic material such as a polyimide resin or an acryl resin may be coated, and then exposure and developing processes may be performed to form the PDL 195.

Figure 14A:
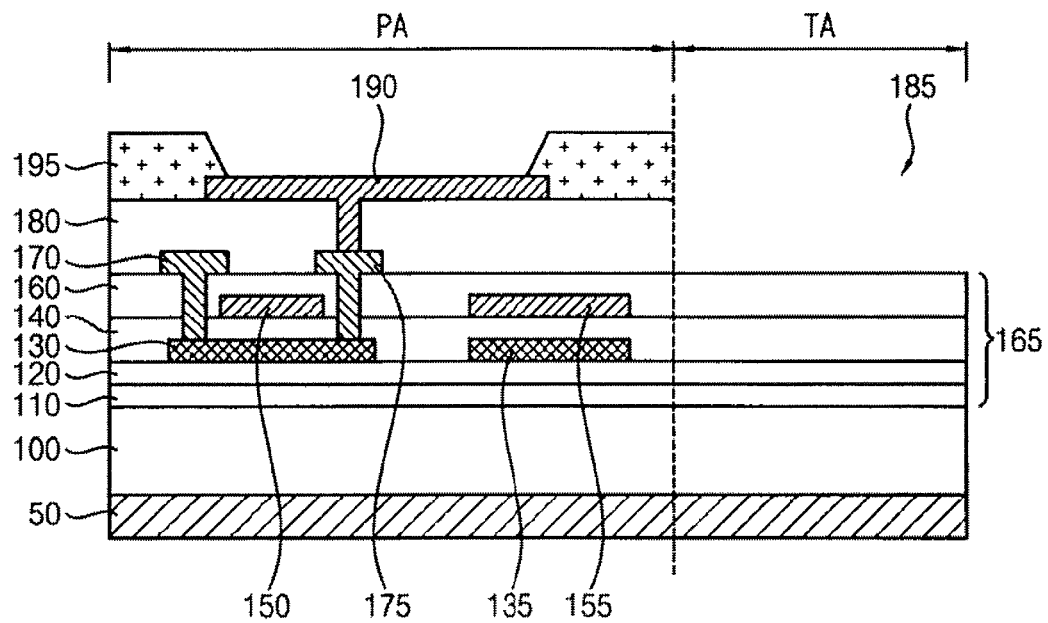
Figure 14B:
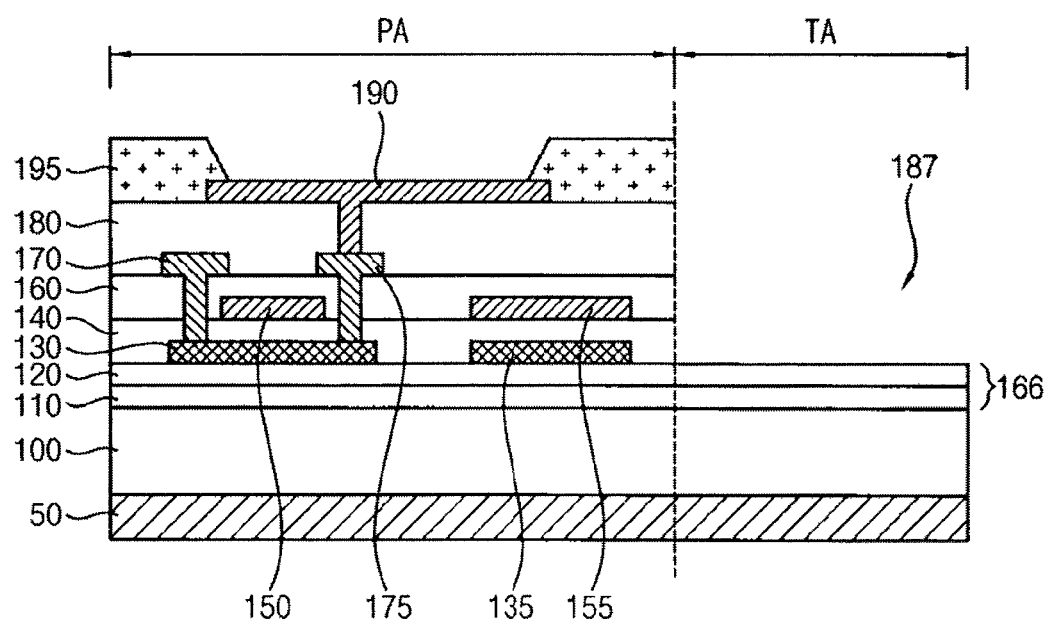

Referring to FIGS. 14A and 14B, portions of the PDL 195 and the insulation layers formed on the transmission area TA may be partially removed to form a transmitting window and a transmitting layer structure.

In an implementation, as illustrated in FIG. 14A, portions of the PDL 195 and the via insulation layer 180 on the transmission area TA may be removed to form the transmitting window 185. A top surface of the insulating interlayer 160 may be exposed by the transmitting window 185. In this case, the transmitting window 185 may be defined by sidewalls of the PDL 195 and the via insulation layer 180, and the top surface of the insulating interlayer 160.

The PDL 195 and the via insulation layer 180 may include substantially the same organic material. Thus, the PDL 195 and the via insulation layer 180 may be removed together by substantially the same etching process or the same developing process, and the transmitting window 185 may be easily formed.

The insulation layers remaining on the transmission area TA may be defined as a transmitting layer structure 165. In an implementation, the transmitting layer structure 165 may include the barrier layer 110, the buffer layer 120, the gate insulation layer 140, and the insulating interlayer 160 sequentially stacked on the base substrate 100 of the transmission area TA.

In an implementation, the barrier layer 110 and the buffer layer 120 may have a substantially single composition consisting essentially of silicon oxynitride.

In an implementation, the transmitting layer structure 165 may have entirely a single composition consisting essentially of silicon oxynitride. In this case, the layers included in the transmitting layer structure 165 may be merged with each other to be converted into the single-layered structure as illustrated in FIG. 3.

In an implementation, as illustrated in FIG. 14B, portions of the insulating interlayer 160 and the gate insulation layer 140 on the transmission area TA may be partially removed to form a transmitting window 187 expanded more than the transmitting window 185 of FIG. 14A. Accordingly, the transmitting window 187 may be defined by sidewalls of the PDL 195, the via insulation layer 180, the insulating interlayer 160 and the gate insulation layer 140, and a top surface of the buffer layer 120.

Portions of the barrier layer 110 and the buffer layer 120 remaining on the transmission area TA may be defined as a transmitting layer structure 166. The transmitting layer structure 166 may have a substantially single composition consisting essentially of silicon oxynitride. In an implementation, the transmitting layer structure 166 may have a substantially single-layered structure as illustrated in FIG. 5.

Figure 15A:
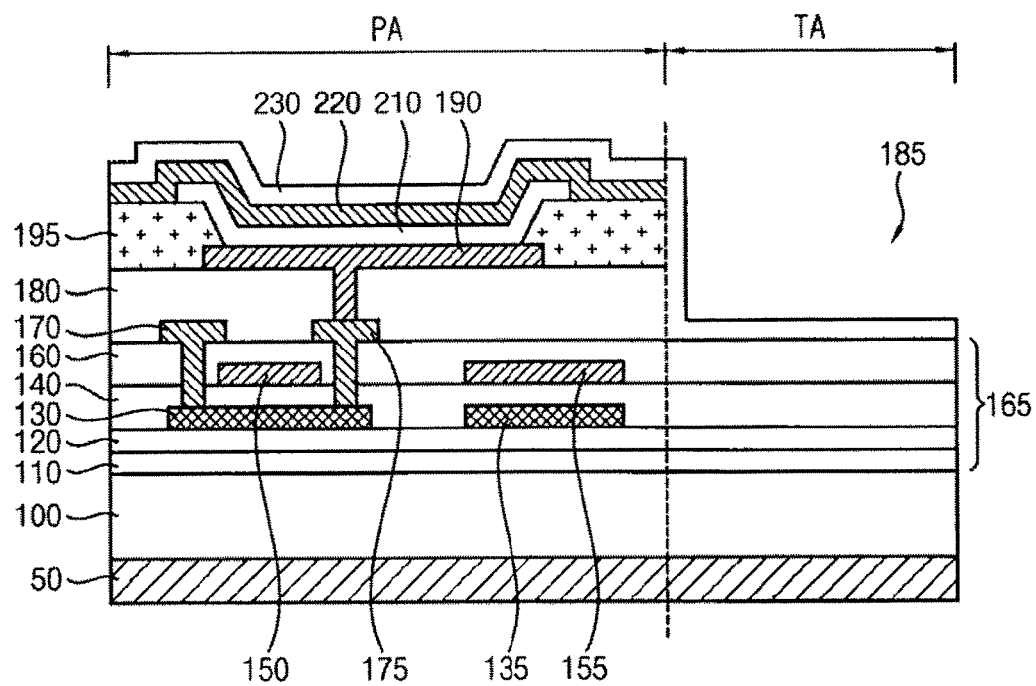
Figure 15B:
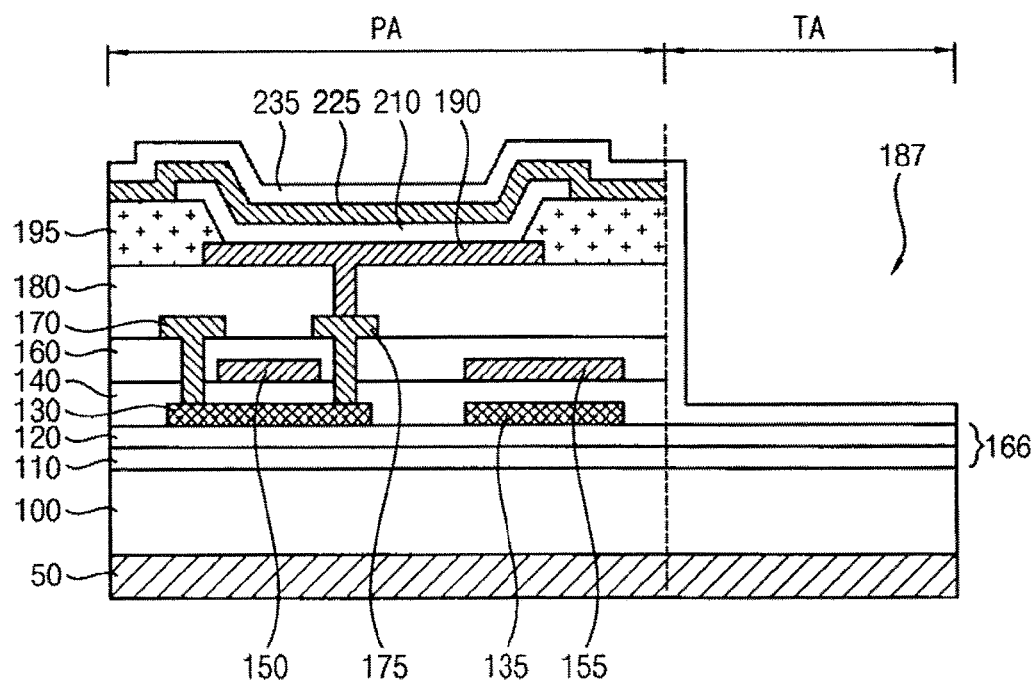

Referring to FIGS. 15A and 15B, a display layer 210 and an opposing electrode 220 and 225 may be formed selectively on the pixel area PA, and an encapsulation layer 230 and 235 commonly covering the pixel area PA and the transmission area TA may be formed.

The display layer 210 may be formed using an organic light emitting material for generating a red color of light, a blue color of light or a green color of light. For example, the display layer 210 may be formed by a spin coating process, a roll printing process, a nozzle printing process, an inkjet process, etc., using a fine metal mask (FMM) that may include an opening through which a region corresponding to a red pixel, a green pixel, or a blue pixel is exposed. Accordingly, an organic emitting layer including the organic light emitting material may be individually formed in each pixel.

In an implementation, an HTL may be formed before the formation of the organic emitting layer using the above-mentioned hole transport material. An ETL may be also formed on the organic emitting layer using the above-mentioned electron transport material. The HTL and the ETL may be formed conformally on surfaces of the PDL 195 and the pixel electrode 190 to be provided commonly on a plurality of pixels. In an implementation, the HTL or the ETL may be patterned per each pixel by processes substantially the same as or similar to those for the organic emitting layer.

A metal having a low work function such as Al, Ag, W, Cu, Ni, Cr, Mo, Ti, Pt, Ta, Nd or Sc, or an alloy of the metals may be deposited on the display layer 210 to form the opposing electrode 220 and 225. For example, a mask including an opening through which a plurality of the pixels are commonly exposed and covering the transmission area TA may be used to deposit the metal by, e.g., a sputtering process for the formation of the opposing electrode 220 and 225.

The encapsulation layer 230 and 235 may be formed on the opposing electrode 220 and 225. The encapsulation layer 230 and 235 may cover the opposing electrode 220 and 225 and may extend on the transmission area TA along a sidewall and a bottom of the transmitting window 185 and 187.

The encapsulation layer 230 and 235 may be formed of an inorganic material such as silicon nitride and/or a metal oxide. In an implementation, the encapsulation layer 230 and 235 may be formed of silicon oxynitride substantially the same as or similar to that of the transmitting layer structure 165 and 166.

In an implementation, a capping layer may be further formed before the formation of the encapsulation layer 230 and 235 using an organic material such as a polyimide resin, an epoxy resin or an acryl resin, or an inorganic material such as silicon oxide, silicon nitride or silicon oxynitride.

Figure 16A:
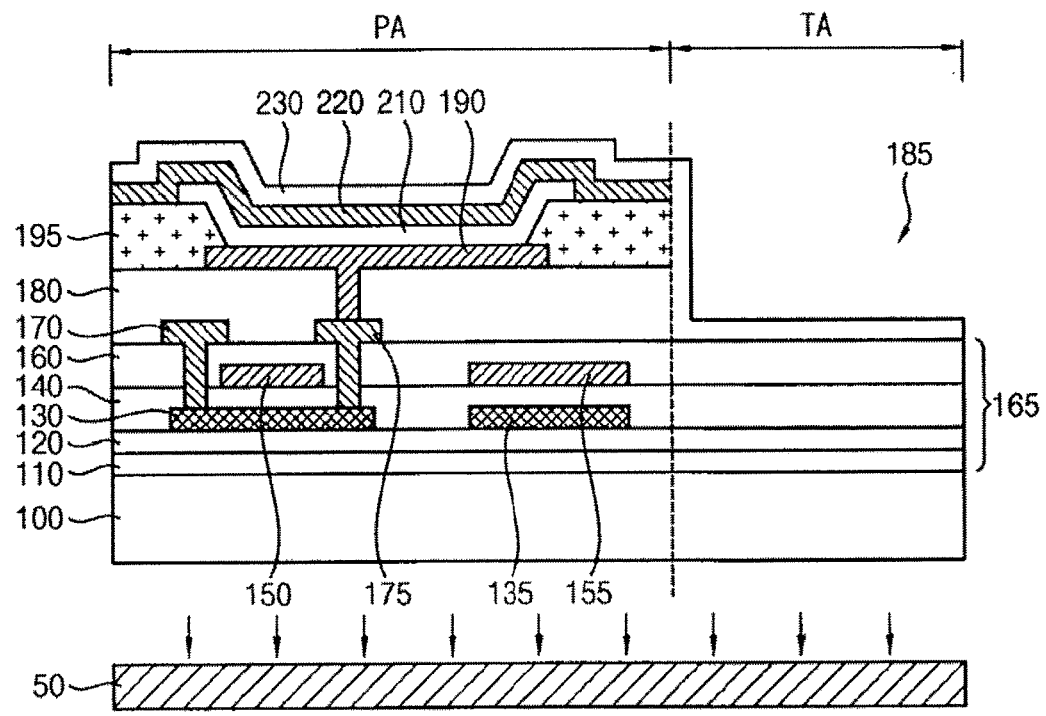
Figure 16B:
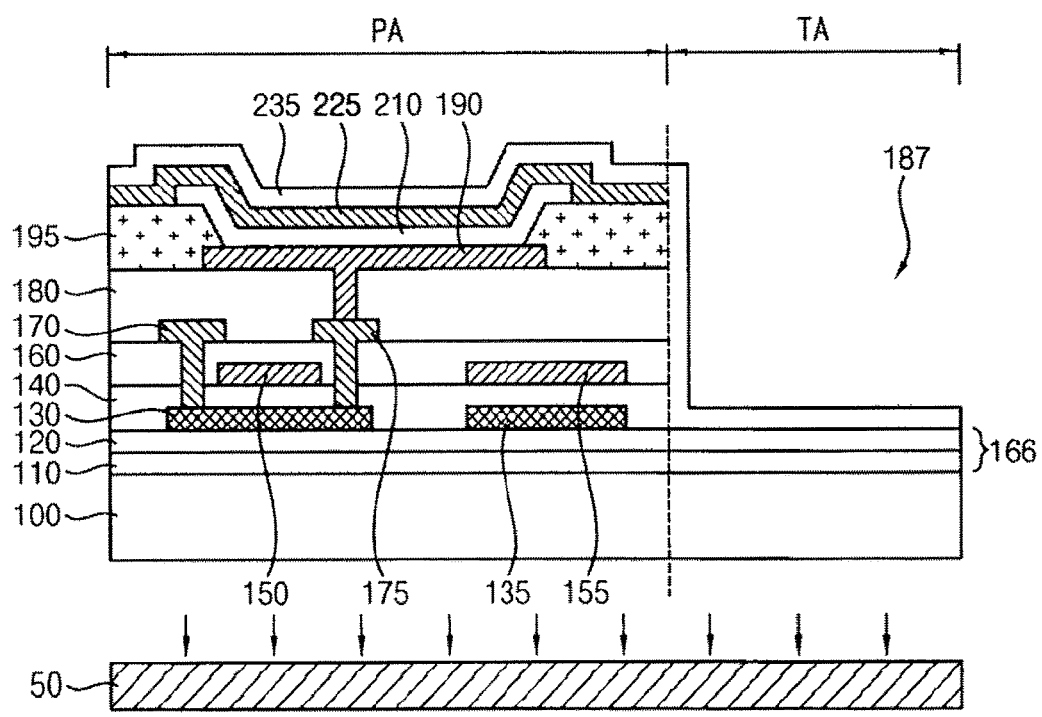

Referring to FIGS. 16A and 16B, the base substrate 100 may be separated from the carrier substrate 50. For example, a laser-lift process may be performed to separate the carrier substrate 50 from the base substrate 110. In an implementation, a mechanical tension may be applied to detach the carrier substrate 50 without performing the laser-lift process.

Figure 17A:
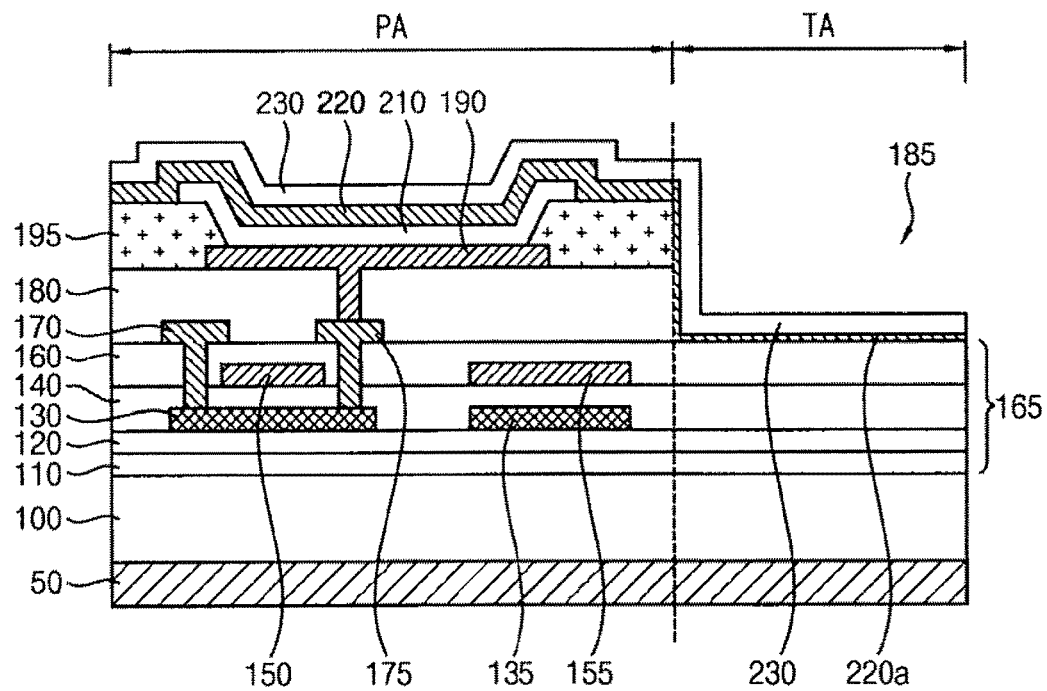
Figure 17B:
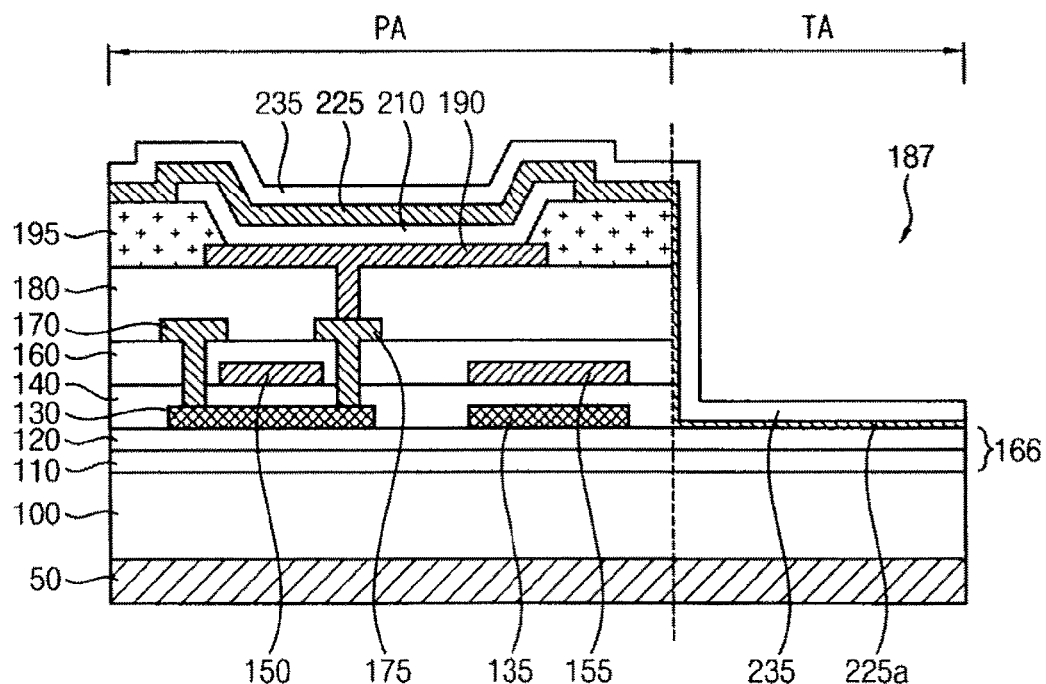

In an implementation, as illustrated in FIGS. 17A and 17B, the opposing electrodes 220 and 225 may be formed commonly and continuously on the pixel area PA and the transmission area PA. In this case, the opposing electrodes 220 and 225 may be formed by a depositing a metal through an open mask that may commonly expose the pixel area PA and the transmission area TA.

A stepped portion may be formed between the pixel area PA and the transmission area PA by the transmitting window 185 and 187. Thus, a distance for depositing the metal may be increased on the transmission area TA so that the opposing electrode 220 and 225 may be formed to have a relatively small thickness on the transmission area TA. Accordingly, an opposing electrode 220a and 225a on the transmission area TA may be formed as a thin layer, and a reduction of transmittance on the transmission area TA may be prevented.

Subsequently, the carrier substrate 50 may be separated from the base substrate 100 as illustrated in FIGS. 16A and 16B such that the transparent display device according to example embodiments may be obtained.

Figure 18:
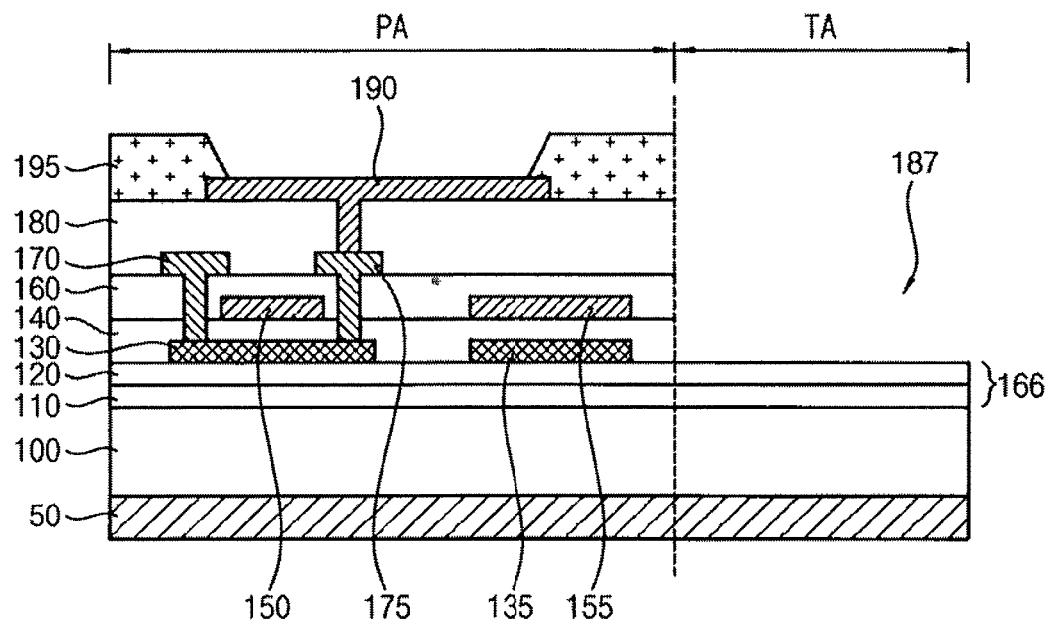
FIGS. 18 to 20 illustrate cross-sectional views of stages in a method of manufacturing a transparent display device in accordance with example embodiments.
Figure 19:
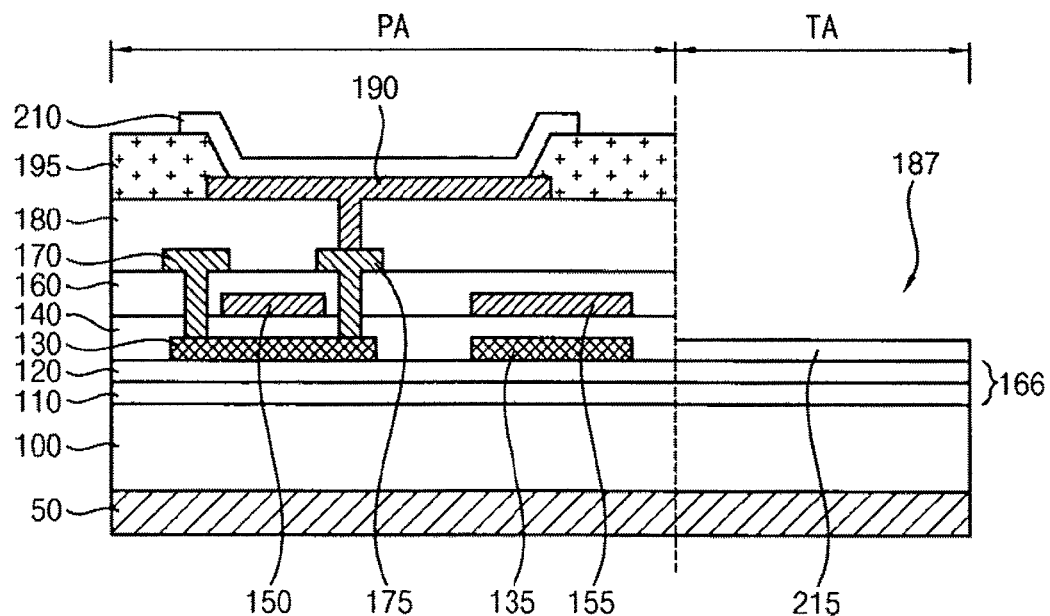
Figure 20:
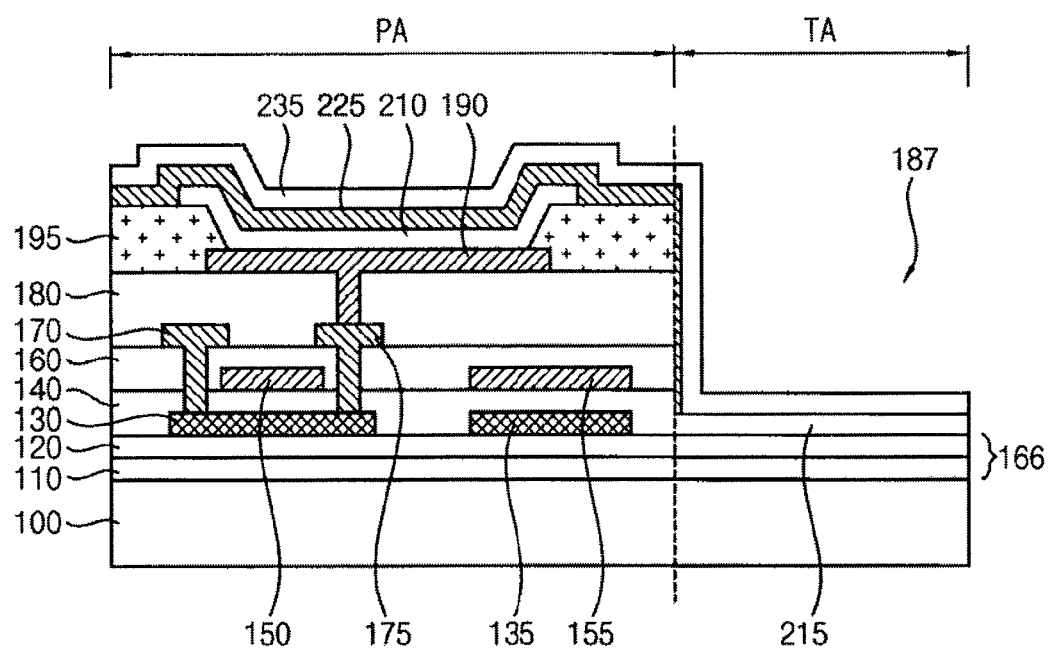

FIGS. 18 to 20 illustrate cross-sectional views of stages in a method of manufacturing a transparent display device in accordance with example embodiments. Detailed descriptions on processes and/or materials substantially the same as or similar to those illustrated with reference to FIGS. 11 to 17B are omitted.

Referring to FIG. 18, processes substantially the same as or similar to those illustrated with reference to FIGS. 11 to 14B may be performed to form a pixel circuit, insulation layers, a pixel electrode 190 and a PDL 195 on a pixel area PA, and form a transmitting window 187 and a transmitting layer structure 166 on a transmission area TA.

Referring to FIG. 19, a deposition control layer 215 may be formed on a top surface of the transmitting layer structure 166 exposed through the transmitting window 187. The deposition control layer 215 may be formed by printing or depositing a deposition control material through, e.g., a fine metal mask selectively exposing the transmission area TA.

As mentioned above, the deposition control material may have a non-light emitting property, and may also have an affinity and/or an adhesion for a conductive material such as a metal lower than those of a display layer 210.

Referring to FIG. 20, processes substantially the same as or similar to those illustrated with reference to FIGS. 17A and 17B may be performed to form an opposing electrode 225 and an encapsulation layer 235.

In an implementation, while depositing a metal by, e.g., a sputtering process for the formation of the opposing electrode 225, the opposing electrode 225 may be substantially and selectively formed on the pixel area PA because the deposition control layer 215 may have the poor affinity and/or adhesion for the metal. In an implementation, as illustrated in FIG. 20, the opposing electrode 225 may be also formed on a sidewall of the transmitting window 187 to have a relatively small thickness.

Subsequently, as illustrated with reference to FIGS. 16A and 16B, steps may be performed such that a carrier substrate 50 may be separated from a base substrate 100 to obtain the transparent display device in accordance with example embodiments.

Hereinafter, properties of the transparent display devices in accordance with example embodiments are described in more detail with reference to Experimental Example.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXPERIMENTAL EXAMPLE

Evaluation on Transmittances Varying Insulation Layer Structures

A barrier layer, a buffer layer, a gate insulation layer, and an insulating interlayer, each of which included stacked silicon oxide layer and silicon nitride layer were sequentially formed on a polyimide substrate having a thickness of 10 micrometers to obtain stacked structures of Comparative Examples 1 to 3.

A barrier layer, a buffer layer, a gate insulation layer, and an insulating interlayer, each of which was formed of silicon oxynitride, e.g., had a single composition of silicon oxynitride, were sequentially formed on the polyimide substrate to obtain a stacked structure of Example 1.

Specific structures of Comparative Examples 1 to 3 and Example 1 are shown in Table 1 below. In Table 1, the silicon oxide layer, the silicon nitride layer, and a silicon oxynitride layer are abbreviated as an oxide, a nitride, and an oxynitride, respectively.

TABLE 1

|  | Barrier Layer | Buffer Layer | Gate Insulation Layer | Insulating Interlayer |
| --- | --- | --- | --- | --- |
| Comparative Example 1 | oxide (1,500 Å)/ nitride (600 Å)/ oxide (1,500 Å) | nitride (1,000 Å)/ oxide (3,000 Å) | oxide (750 Å)/ nitride (400 Å) | oxide (3,000 Å)/ nitride (2,000 Å) |
| Comparative Example 2 | oxide (600 Å)/ nitride (1,500 Å)/ oxide (600 Å) | nitride (1,000 Å)/ oxide (3,000 Å) | oxide (750 Å)/ nitride (400 Å) | oxide (3,000 Å)/ nitride (2,000 Å) |
| Comparative Example 3 | oxide (5,000 Å)/ nitride (600 Å) | nitride (1,000 Å)/ oxide (3,000 Å) | oxide (750 Å)/ nitride (400 Å) | oxide (3,000 Å)/ nitride (2,000 Å) |

TABLE 1-continued

|  | Barrier Layer | Buffer Layer | Gate Insulation Layer | Insulating Interlayer |
|---|---|---|---|---|
| Example 1 | oxynitride (5,600 Å) | oxynitride (4,000 Å) | oxynitride (1,150 Å) | oxynitride (5,000 Å) |

A light was irradiated over each stacked structures of Comparative Examples 1 to 3 and Example 1, and transmittances were measured. The measured values are shown in Table 2 below.

TABLE 2

|  | Comparative Example 1 | Comparative Example 2 | Comparative Example 3 | Example 1 |
|---|---|---|---|---|
| Transmittance | 63.1% | 60.3% | 63.3% | 89.7% |

As shown in FIG. 2, when the stacked structure was formed of silicon oxynitride, e.g., the single composition of silicon oxynitride, the transmittance was drastically increased compared to those measured in Comparative Examples 1 to 3, having repeatedly stacked different insulation layers.

By way of summation and review, in order to realize a sufficient transmittance, an optimization of a composition, an arrangement, a thickness, etc., of a substrate, an electrode, an insulation layer, or the like may be considered. For example, the OLED device may include a plurality of insulation layers including different types of materials, and thus a desired optical property may not be easily obtained.

According to example embodiments, insulation layers stacked on a transparent display substrate may be formed of silicon oxynitride, e.g., a single composition of silicon oxynitride. Accordingly, a reduction of transmittance due to, e.g., a refractive index change or difference may be minimized while retaining a dielectric property and a protective property from moisture and/or impurities diffusion. Therefore, a transparent display device having an improved transmittance may be achieved.

The embodiments may provide a transparent display substrate or a transparent display device that includes stacked insulation layers.

The embodiments may provide a transparent display substrate having an improved transmittance.

The embodiments may provide a transparent display device having an improved transmittance.

The embodiments may provide a method of manufacturing a transparent display device having an improved transmittance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transparent display device, comprising:
   a base substrate including a pixel area and a transmission area;
   a pixel circuit on the pixel area of the base substrate;
   a pixel electrode selectively disposed on the pixel area of the base substrate, the pixel electrode being electrically connected to the pixel circuit;
   a pixel defining layer partially covering the pixel electrode on the pixel circuit;
   a display layer on the pixel electrode;
   an opposing electrode facing the pixel electrode on the display layer;
   a transmitting layer structure selectively disposed on the transmission area of the base substrate, the transmitting layer structure including at least an inorganic material, the inorganic material consisting essentially of silicon oxynitride;
   a transmitting window defined on the transmission area of the base substrate, a top surface of the transmitting layer structure facing the transmitting window; and
   a deposition control layer on the transmitting layer structure such that the deposition control layer continuously covers the transmitting layer structure,
   wherein the opposing electrode is not disposed on a top surface of the deposition control layer, and
   wherein the opposing electrode covers the pixel defining layer and the display layer on the pixel area, and is disposed only on a sidewall of the transmitting window on the transmission area.

2. The transparent display device as claimed in claim 1, wherein the deposition control layer includes a material having an affinity and/or an adhesion for a conductive material that is lower than those of the display layer and the transmitting layer structure.

3. The transparent display device as claimed in claim 1, wherein the deposition control layer includes N,N'-diphenyl-N,N'-bis(9-phenyl-9H-carbazol-3-yl)biphenyl-4,4'-diamine, N(diphenyl-4-yl)9,9-dimethyl-N-(4(9-phenyl-9H-carbarzol-3-yl)phenyl)-9H-fluorene-2-amine, or 2-(4-(9,10-di(naphthalen-2-yl)anthracen-2-yl)phenyl)-1-phenyl-1H-benzo-[D]imidazole.

4. The transparent display device of claim 1, wherein a thickness of a portion of the opposing electrode disposed on the sidewall of the transmitting window has a relatively small thickness as compared to a thickness of a portion of the opposing electrode facing the pixel electrode.

5. The transparent display device of claim 1, further comprising:
   an encapsulation layer covering the opposing electrode on the pixel area and disposed on the sidewall and a bottom of the transmitting window,
   wherein the encapsulation layer is disposed as a uniform thickness along a profile of the opposing electrode and the deposition control layer on the substrate.

6. The transparent display device of claim 5, wherein the encapsulation layer includes silicon oxynitride.

* * * * *